(12) United States Patent
Kim et al.

(10) Patent No.: US 8,801,279 B2
(45) Date of Patent: Aug. 12, 2014

(54) SEMICONDUCTOR DEVICE WITH STACKED STRUCTURE HAVING THROUGH ELECTRODE, SEMICONDUCTOR MEMORY DEVICE, SEMICONDUCTOR MEMORY SYSTEM, AND OPERATING METHOD THEREOF

(75) Inventors: Jung-sik Kim, Seoul (KR); Dong-hyuk Lee, Seoul (KR); Ho-cheol Lee, Yongin-si (KR); Jang-woo Ryu, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 302 days.

(21) Appl. No.: 13/177,103

(22) Filed: Jul. 6, 2011

(65) Prior Publication Data
US 2012/0163413 A1 Jun. 28, 2012

(30) Foreign Application Priority Data
Dec. 28, 2010 (KR) .................. 10-2010-0137228

(51) Int. Cl.
| | | |
|---|---|---|
| H01L 35/00 | (2006.01) | |
| G01K 13/00 | (2006.01) | |
| H01L 23/525 | (2006.01) | |
| G01K 13/10 | (2006.01) | |
| H01L 25/065 | (2006.01) | |
| G01K 7/01 | (2006.01) | |
| H01L 23/34 | (2006.01) | |
| H01L 23/00 | (2006.01) | |
| H01L 23/48 | (2006.01) | |

(52) U.S. Cl.
CPC ... *H01L 23/5258* (2013.01); *H01L 2225/06517* (2013.01); *H01L 2224/16225* (2013.01); *H01L 2924/01019* (2013.01); *H01L 2924/01055* (2013.01); *H01L 2225/06513* (2013.01); *G01K 13/10* (2013.01); *H01L 2225/06541* (2013.01); *H01L 25/0657* (2013.01); *H01L 2224/16145* (2013.01); *H01L 2225/06589* (2013.01); *H01L 2924/01068* (2013.01); *G01K 7/01* (2013.01); *H01L 24/16* (2013.01); *H01L 23/481* (2013.01); *H01L 23/34* (2013.01)
USPC .......................................... 374/152; 374/170

(58) Field of Classification Search
USPC .................................. 374/152, 153
See application file for complete search history.

(56) References Cited

U.S. PATENT DOCUMENTS

| | | | |
|---|---|---|---|
| 6,798,049 B1 | 9/2004 | Shin et al. | |
| 8,022,554 B2 * | 9/2011 | Gupta et al. | 257/777 |
| 2007/0059918 A1 | 3/2007 | Jung et al. | |
| 2007/0296071 A1 * | 12/2007 | Chiu et al. | 257/678 |

FOREIGN PATENT DOCUMENTS

| | | |
|---|---|---|
| JP | 08-148825 | 6/1996 |
| JP | 2001-077301 | 3/2001 |
| JP | 2007-081408 | 3/2007 |
| KR | 10-2001-0018945 A | 3/2001 |
| KR | 100661297 B1 | 12/2006 |

* cited by examiner

*Primary Examiner* — Mirellys Jagan
(74) *Attorney, Agent, or Firm* — Muir Patent Consulting, PLLC

(57) ABSTRACT

A semiconductor device, memory device, system, and method of using a stacked structure for stably transmitting signals among a plurality of semiconductor layers is disclosed. The device includes at least a first semiconductor chip including a first temperature sensor circuit configured to output first temperature information related to the first semiconductor chip, and at least one through substrate via.

8 Claims, 23 Drawing Sheets

FIG. 8
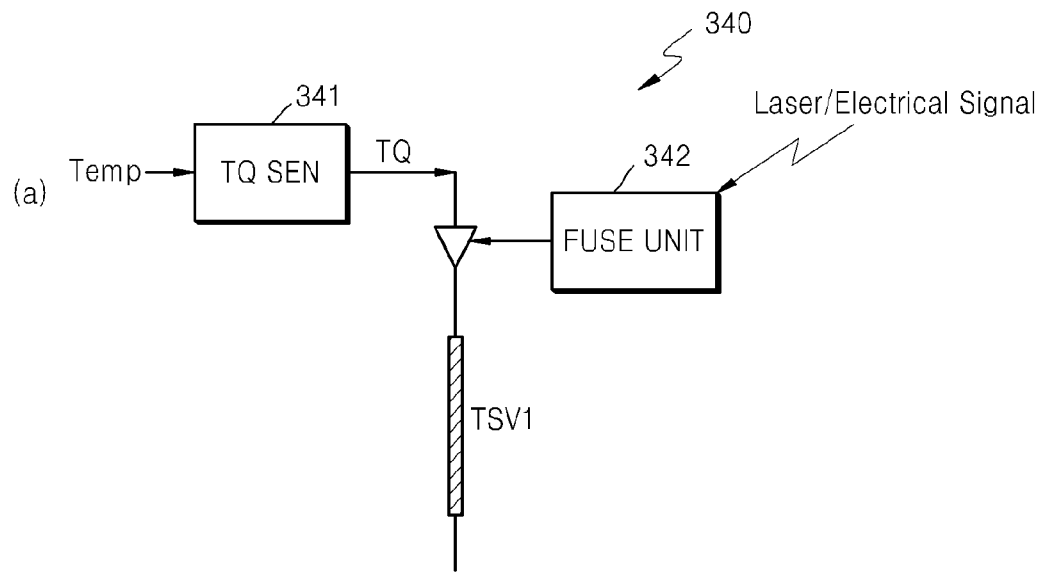
(a)
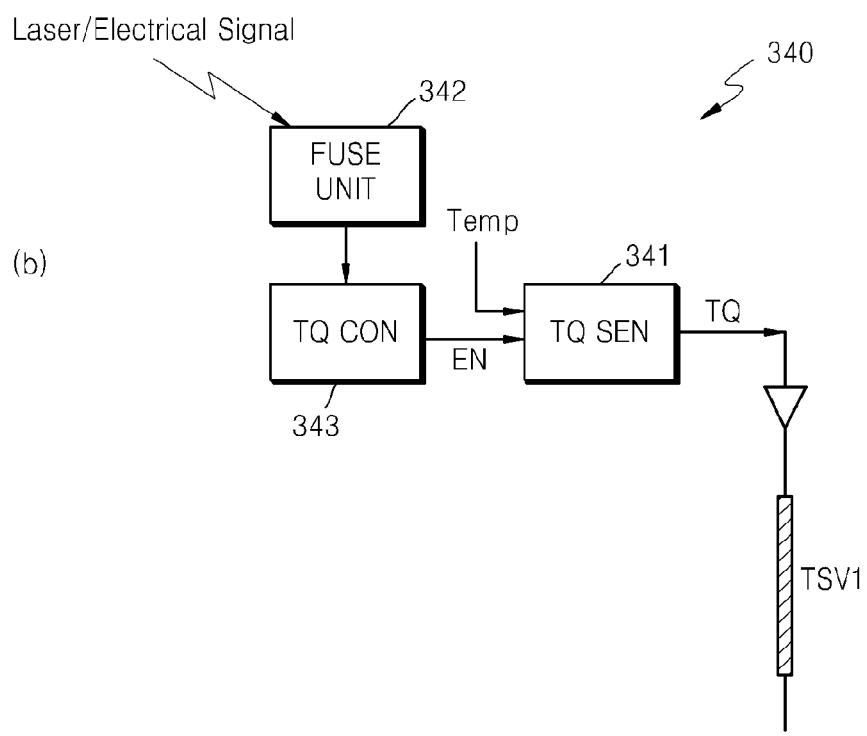
(b)

FIG. 21
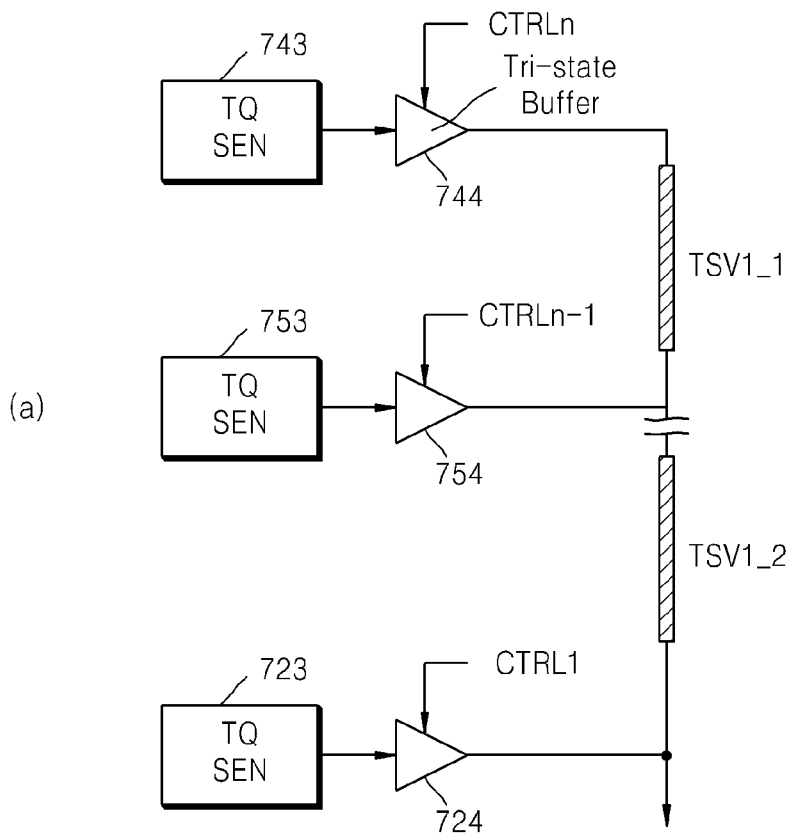
(a)
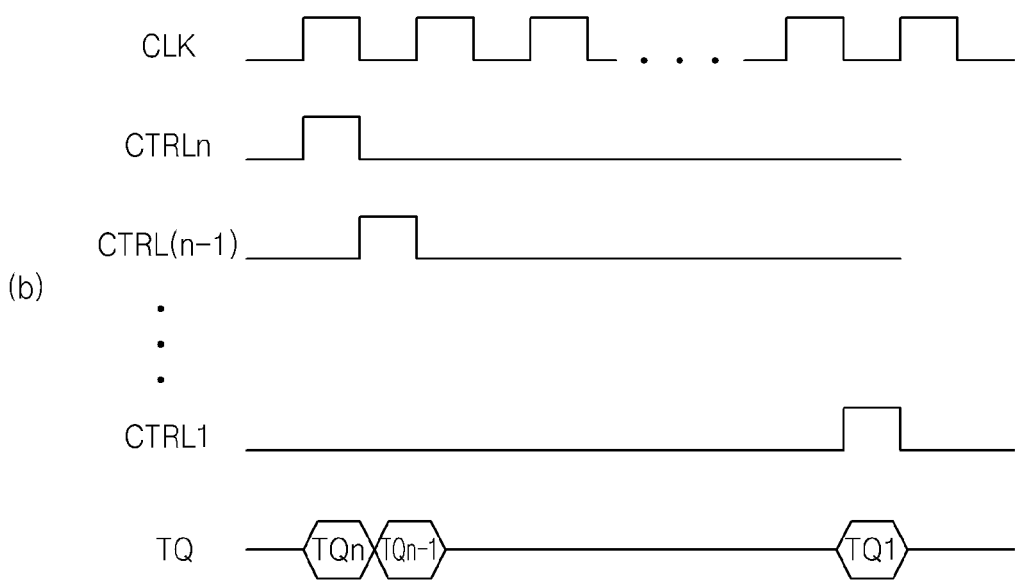
(b)

SEMICONDUCTOR DEVICE WITH STACKED STRUCTURE HAVING THROUGH ELECTRODE, SEMICONDUCTOR MEMORY DEVICE, SEMICONDUCTOR MEMORY SYSTEM, AND OPERATING METHOD THEREOF

CROSS-REFERENCE TO RELATED APPLICATIONS

This application claims the benefit of Korean Patent Application No. 10-2010-0137228 filed on, Dec. 28, 2010, in the Korean Intellectual Property Office, the disclosure of which is incorporated herein in its entirety by reference.

BACKGROUND

The present disclosure relates to a semiconductor device with a stacked structure having a through electrode, and more particularly, to a semiconductor device having a structure for preventing collisions among pieces of information transmitted among a plurality of semiconductor layers.

The high integration of a general 2-dimensional (2D) structure has nearly reached a limit with the gradual high integration of a semiconductor device, e.g., a semiconductor memory device or the like. A semiconductor memory device having a 3-dimensional (3D) structure surpassing such a 2D structure needs to be realized, and research to realize the semiconductor device has been attempted.

A semiconductor device having a 3D structure includes a plurality of semiconductor layers among which signals, such as various types of data, commands, addresses or the like, are transmitted. Through-silicon vias (TSVs) are disposed in the semiconductor device to transmit the signals among the semiconductor layers, and some or all of the signals are transmitted through the TSVs.

As described above, the signals are transmitted through the TSVs of the plurality of semiconductor layers, but some of the signals are transmitted through a common TSV of the plurality of semiconductor layers. Accordingly, if the signals are transmitted among the plurality of semiconductor layers, the signals may collide with one another. In this case, accurate values of the signals may not be transmitted, and thus a performance of the semiconductor device or a semiconductor system using the semiconductor device may deteriorate.

SUMMARY

The present disclosure provides a semiconductor device with a stacked structure for stably transmitting signals among a plurality of semiconductor layers, a semiconductor memory device, and an operating method thereof.

The disclosure also provides a semiconductor memory system using a semiconductor memory device with a stacked structure for stably transmitting signals.

BRIEF DESCRIPTION OF THE DRAWINGS

Exemplary embodiments will be more clearly understood from the following detailed description taken in conjunction with the accompanying drawings in which:

FIGS. 8A and 8B are block diagrams illustrating an exemplary structure of a part of a logic region of the semiconductor device of FIG. 7, according to certain embodiments;

FIGS. 21A and 21B respectively illustrate an exemplary modification of a logic circuit of the semiconductor device of FIG. 20 and exemplary waveforms of a signal, according to certain embodiments;

DETAILED DESCRIPTION

Figure 1:
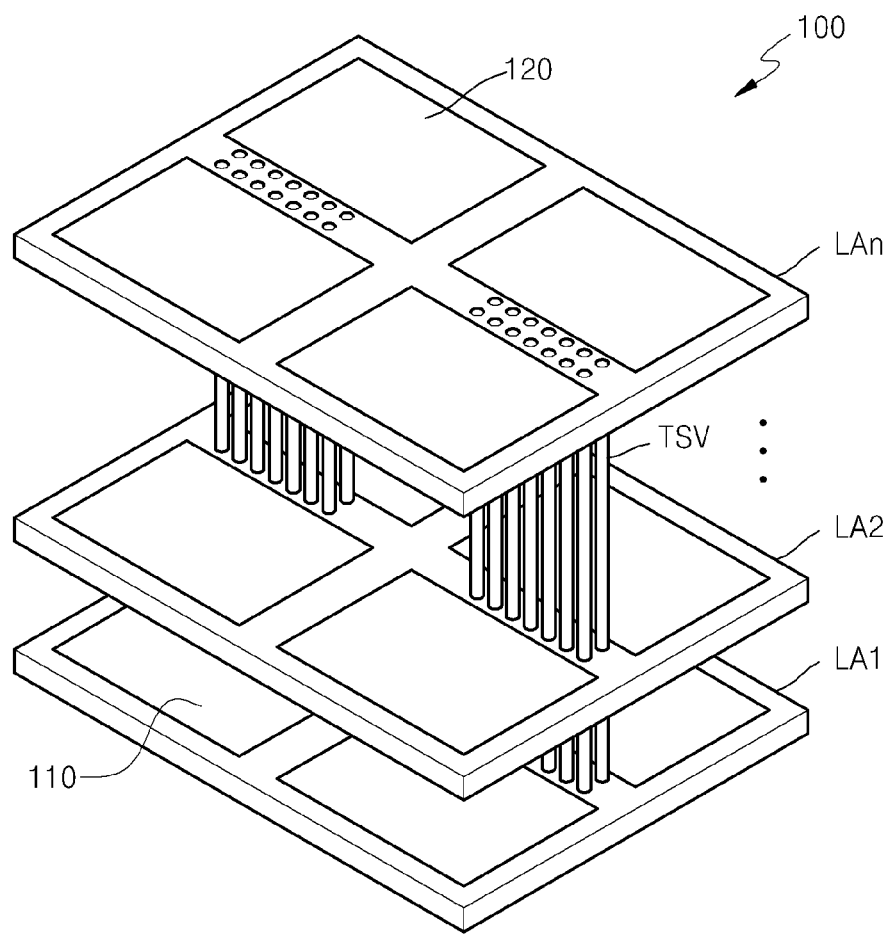
FIG. 1 is a schematic perspective view illustrating an exemplary semiconductor device with a stacked structure including a plurality of semiconductor layers, according to one embodiment.

The present disclosure will now be described more fully with reference to the accompanying drawings, in which exemplary embodiments are shown. The disclosed embodiments may, however, be embodied in many different forms and should not be construed as being limited to the embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an edge or corner region illustrated as having sharp edges may have somewhat rounded or curved features. Likewise, elements illustrated as circular or spherical may be oval in shape or may have certain straight or flattened portions. Thus, the regions illustrated in the figures are schematic in nature and their shapes are not intended to illustrate the actual shape of a region or element of a device and are not intended to limit the scope of the disclosed embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A memory device, which is a semiconductor device, may be a volatile memory, such as a dynamic random access memory (DRAM), a static random access memory (SRAM), or the like, or a nonvolatile memory, such as a phase change random access memory (PRAM), a resistive random access memory (RRAM) using a variable resistive characteristic material, such as complex metal oxides or the like, a magnetic random access memory (MRAM) using a ferromagnetic material, flash memory, EEPROM, and the like.

A semiconductor memory device, as well as the above-described memories, has adopted a 3-dimensional (3D) structure concept. The 3-D structure concept has already been used in the packaging field, but the operations of an existing method is to dispose various terminals on a side of a semiconductor chip and electrically connect signal terminals of a plurality of chips using wire bonding. Therefore, the existing method increases the sizes of chips, complexity of wires, power consumption, and the like.

Accordingly, a technique for forming vertical through electrodes in silicon, a material of a semiconductor substrate, and providing signal transmission paths has been suggested. Since through electrodes penetrate a silicon substrate differently from general contact plugs, the through electrodes may be referred to as through-silicon vias, or through-substrate vias (TSVs).

Since such a TSV technique has an effect to greatly improve the integration of circuits, an operation speed, power consumption, manufacturing cost, etc., the TSV technique has been applied to the development of a chip having a multiprocessor core and competitively developed in the field of NAND flash memory, memory such as a DRAM or the like, hybrid memory, and the like.

FIG. 1 is a schematic perspective view illustrating an exemplary semiconductor device 100 with a stacked structure including a plurality of semiconductor layers, according to one embodiment. As shown in FIG. 1, the semiconductor device 100 includes the plurality of semiconductor layers, e.g., first through $n^{th}$ semiconductor layers LA1 through LAn, and TSVs through which signals are transmitted among the first through n$^{th}$ semiconductor layers LA1 through LAn. Each of the first through n$^{th}$ semiconductor layers LA1 through LAn includes circuit blocks for realizing a function of the semiconductor device 100.

A semiconductor memory device including memory cells may be applied as an example of the semiconductor device 100. If the semiconductor device 100 of FIG. 1 is a semiconductor memory device, the circuit blocks disposed in the first through n$^{th}$ semiconductor layers LA1 through LAN may be memory blocks including memory regions. In one embodiment, all the first through n$^{th}$ semiconductor layers LA1 through LAn of the semiconductor device 100 include memory blocks. In other embodiments some or none of the first through n$^{th}$ semiconductor layers LA1 through LAn include memory blocks (for example, some or all of the semiconductor layers may be controller or data processing layers).

For example, all circuit blocks 110 and 120 included in each of the first through n$^{th}$ semiconductor layers LA1 through LAn which are vertically stacked may be memory blocks. One or more (e.g., the first semiconductor layer LA1) of the first through n$^{th}$ semiconductor layers LA1 through LAn of the semiconductor device 100 may operate as a master, and others (e.g., the second through n$^{th}$ semiconductor layers LA2 through LAn) of the first through n$^{th}$ semiconductor layers LA1 through LAn may operate as slaves. In one embodiment, the at least one of the circuit blocks of the first semiconductor layer LA1 may not include memory blocks but instead may include control blocks and may operate as a master of the first through n$^{th}$ semiconductor layers LA1 through LAn. For example, the circuit block 110 of the first semiconductor layer LA1 may include logic circuits for driving memory blocks of the other semiconductor layers (e.g., the second through n$^{th}$ semiconductor layers LA2 through LAn).

In one embodiment, the first through n$^{th}$ semiconductor layers LA1 through LAn transmit and/or receive signals to and/or from one another through the TSVs. The semiconductor device 100 interfaces with an external controller (not shown). Thus, if the semiconductor device 100 is packaged, the semiconductor device 100 is stacked on a substrate (a package substrate) (not shown) and interfaces with the external controller (not shown) through circuit patterns formed in the substrate and conductors formed on an outer surface of the substrate (e.g., conductors such as leads, solder balls, or the like). If one of the first through n$^{th}$ semiconductor layers LA1 through LAn, e.g., the first semiconductor layer LA1, is directly connected to the substrate, the n$^{th}$ semiconductor layer LAn transmits the signal through the TSV to the first semiconductor layer LA1, and then the signal is transmitted to the outside through the substrate.

The first through n$^{th}$ semiconductor layers LA1 through LAn of the semiconductor device 100 transmit various types of signals to the outside through the TSVs or receive signals from the outside through the TSVs. For example, in relation to a memory operation of the semiconductor device 100, data and a data strobe signal may be transmitted to the outside through the TSVs during a data read operation. Besides the signals transmitted according to the memory operation, other various pieces of information may be transmitted to the outside through the TSVs. As examples of the other various pieces of information, temperature information generated by detecting temperatures of the first through n$^{th}$ semiconductor layers LA1 through LAn, state information of each of the first through n$^{th}$ semiconductor layers LA through LAn, such as data written-state information, and the like may be transmitted to the outside through the TSVs.

Each of the first through n$^{th}$ semiconductor layers LA1 through LAn may transmit the data, the data strobe signal, the other various pieces of information, etc., through the same path (an output path including the TSVs). When stacking the first through n$^{th}$ semiconductor layers LA1 through LAn, the TSVs formed in each of the first through n$^{th}$ semiconductor layers LA1 through LAn are aligned with one another, and information (e.g., the temperature information) of the first through n$^{th}$ semiconductor layers LA1 through LAn is transmitted to the TSVs formed in the same positions. If the output path of signals is shared by the signals as described above, data DQ or data strobe signals DQS are generated in response to an external command. Therefore, when the data DQ or the data strobe signals DQS are output, a possibility of collisions among the data DQ or the data strobe signals DQS is lower. However, the temperature information, the state information, or the like is frequently or periodically generated by each of the first through n$^{th}$ semiconductor layers LA1 through LAn regardless of a command. Therefore, when transmitting the temperature information, the state information, or the like, there is a possibility of collisions among the temperature information, the state information, or the like.

Figure 2:
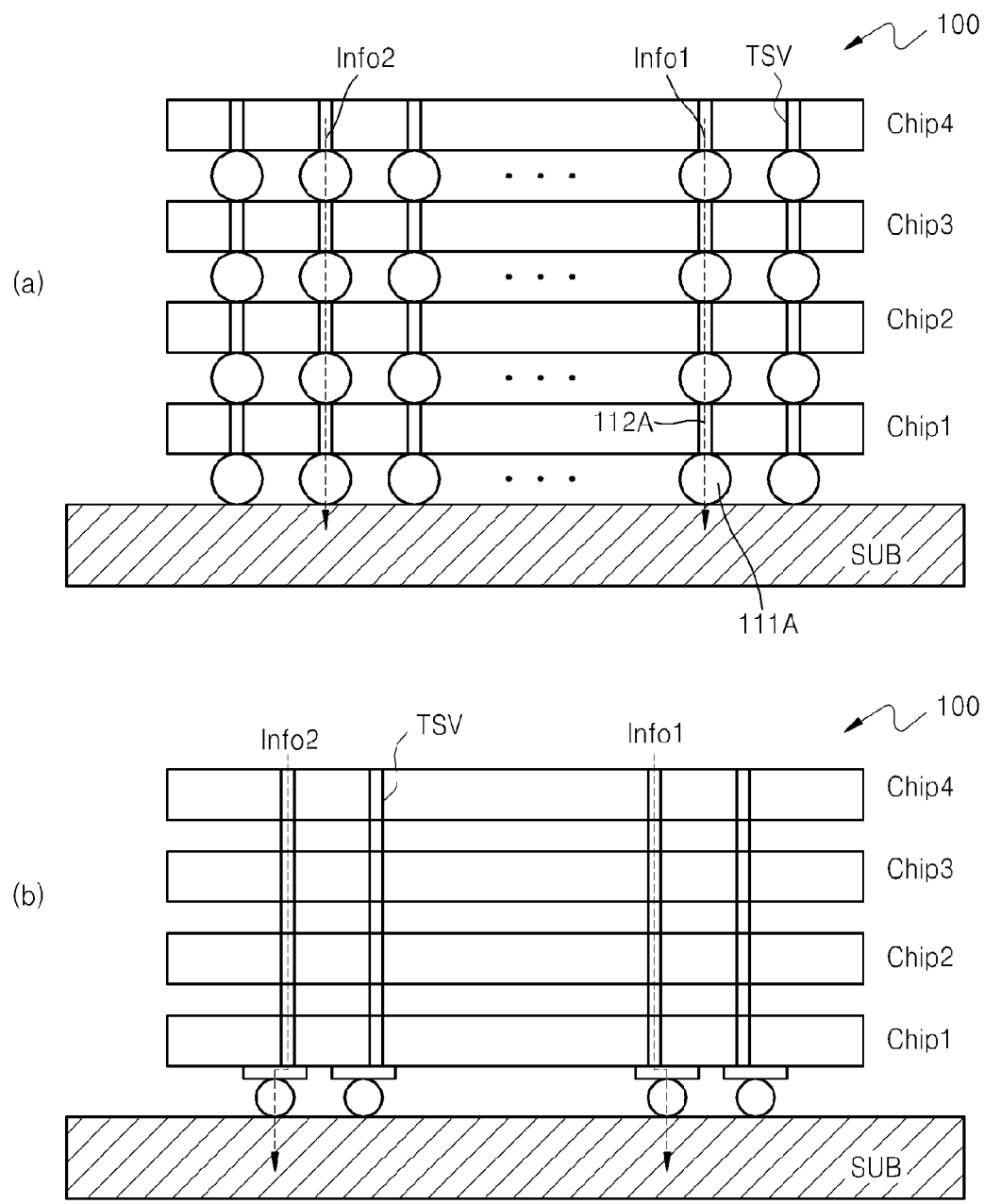
FIGS. 2A and 2B are cross-sectional views respectively illustrating exemplary transmissions of information through through-silicon vias (TSVs) of a semiconductor device such as the semiconductor device of FIG. 1, according to certain embodiments.

FIGS. 2A and 2B are cross-sectional views respectively illustrating exemplary transmissions of information through the TSVs of a semiconductor device such as semiconductor device 100 of FIG. 1, according to certain embodiments. Each of the semiconductor devices 100 in the embodiments shown in FIGS. 2A and 2B includes four semiconductor layers, which are respectively realized as separate chips to include four semiconductor chips Chip1 through Chip4 in each of the semiconductor devices 100. In FIGS. 2A and 2B, substrates SUB, on which the semiconductor devices 100 are installed, are further provided, and the semiconductor devices 100 communicate with external controllers (not shown) through the substrates SUB.

Referring to FIG. 2A, TSVs are formed in each of the semiconductor chips Chip1 through Chip4, and information of one of the semiconductor chips Chip1 through Chip4 is transmitted to the other semiconductor chips Chip1 through Chip4 through the TSVs and conductors (e.g., solder balls) formed on outer surfaces of the semiconductor chips Chip1 through Chip4. The transmission of information through the TSVs may be realized in various forms. For example, information Info1 generated by the first semiconductor chip Chip1 may be electrically connected to a conductor 111A through the TSV 112A of the first semiconductor chip Chip1. Alternatively, if a circuit (not shown) generating the information Info1 is disposed on a lower surface of the first semiconductor chip Chip1, the information Info1 may be directly connected to the conductor 111A. Referring to FIG. 2B, the semiconductor chips Chip1 through Chip4 are stacked, and then the TSVs are formed in each of the semiconductor chips Chip1 through Chip4.

Information Info1 and Info2 shown in each of FIGS. 2A and 2B includes temperature information and state information of each of the semiconductor chips Chip1 through Chip4 and shared output paths for transmitting information to the outside. The information Info1 and Info2 is regularly or periodically generated regardless of whether a chip is selected during a memory operation.

Figure 3A:
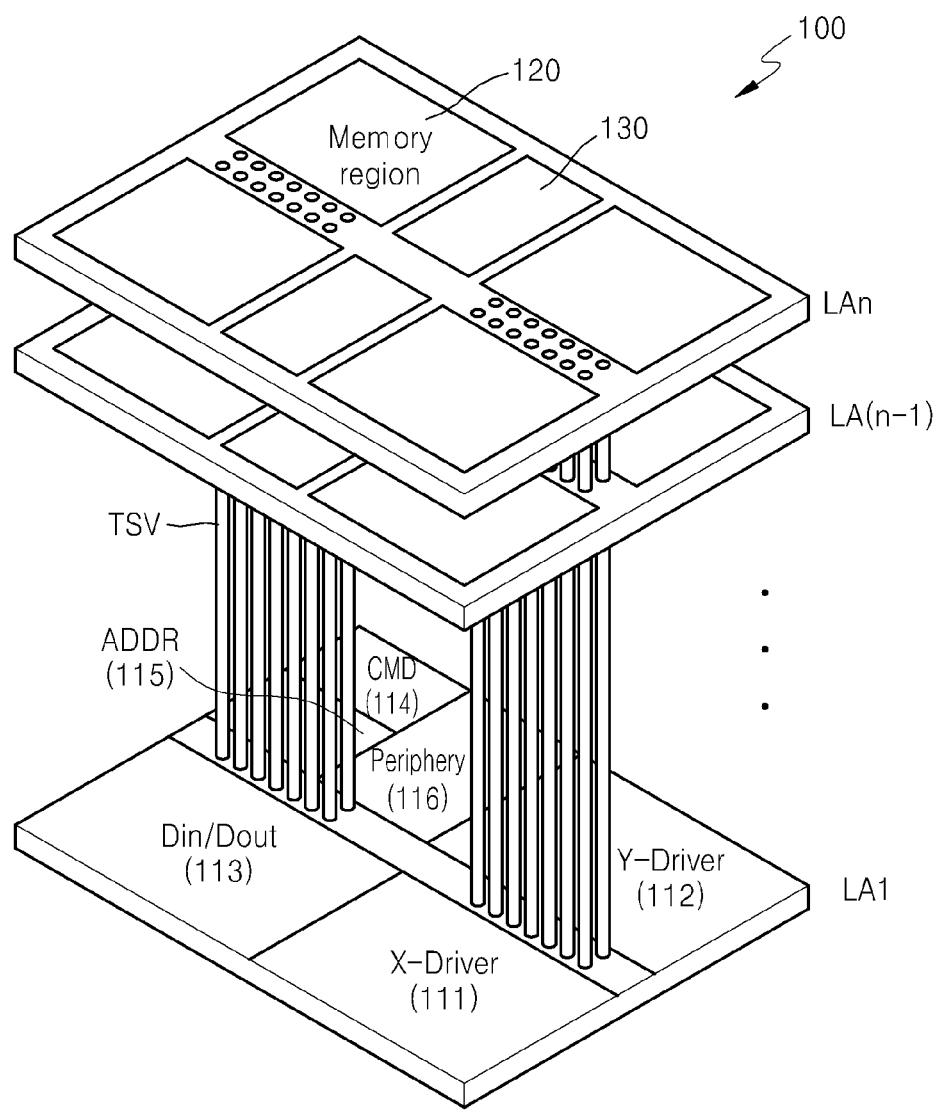
FIGS. 3A through 3C are respectively a perspective view, a block diagram, and a circuit diagram illustrating an exemplary semiconductor device, such as the semiconductor device of FIG. 1, according to certain embodiments.
Figure 3B:
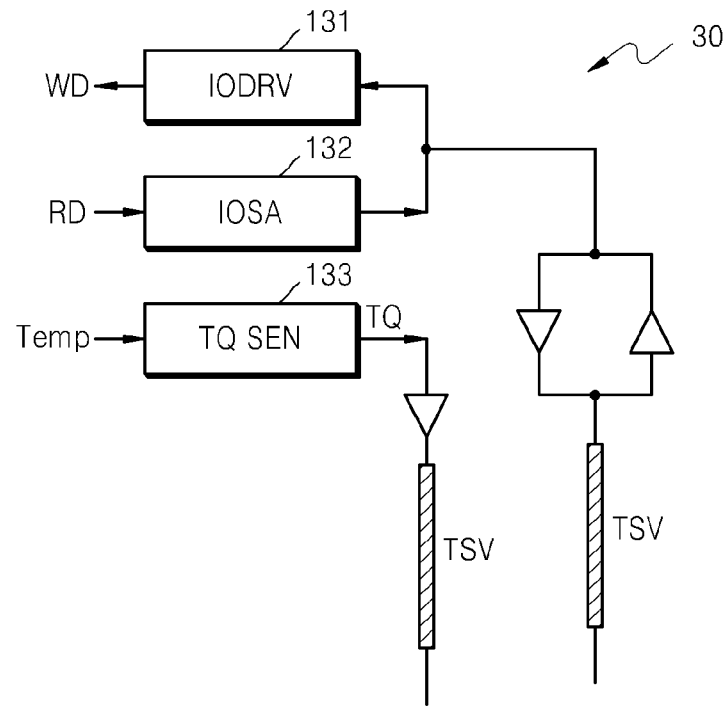
Figure 3C:
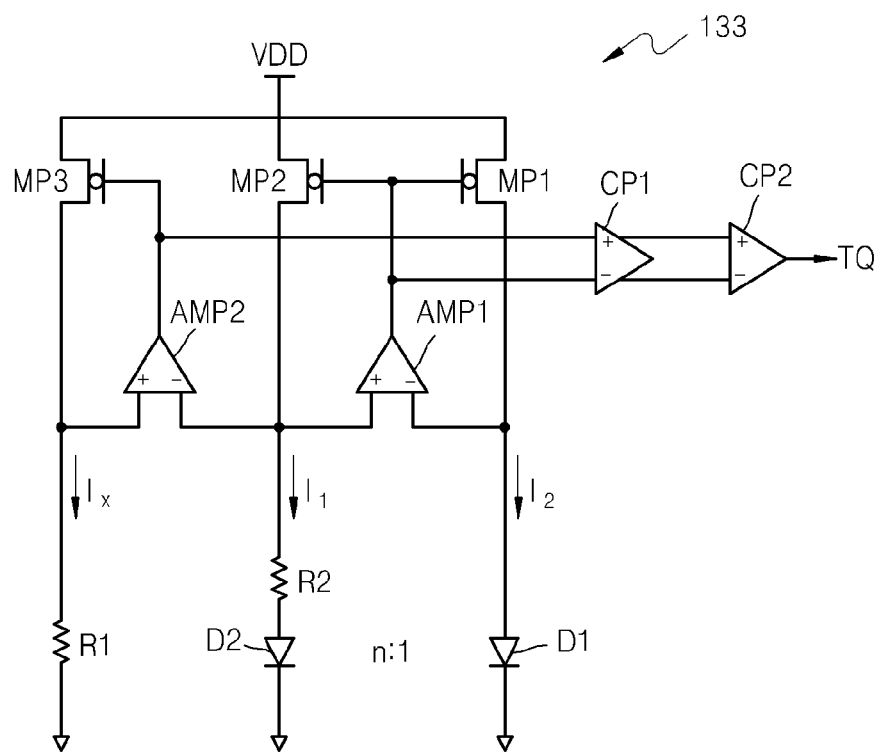

FIGS. 3A, 3B, and 3C are respectively a perspective view, a block diagram, and a circuit diagram illustrating a semiconductor device, such as semiconductor device 100 of FIG. 1, according to certain embodiments. FIG. 3A illustrates a semiconductor memory device including memory cells, and including a plurality of semiconductor layers, e.g., first through n$^{th}$ semiconductor layers LA1 through LAn. The semiconductor device 100 may include a master chip and slave chips, wherein the first semiconductor layer LA1 may be a master chip, and the other semiconductor layers, namely, the second through nth semiconductor layers LA2 through LAn, may be slave chips.

In one embodiment, the first semiconductor layer LA1 includes various types of logic circuits for driving memories. As shown in FIG. 3A, the first semiconductor layer LA1 includes an X-driver 111, a Y-driver 112, a data input/output (Din/Dout) unit 113, a command buffer 114, an address buffer 115, and a peripheral circuit 116. The X-driver 111 drives wordlines of the memories, and the Y-driver 112 drives bitlines of the memories. The Din/Dout unit 113 controls input and/or output of data, and the command buffer 114 receives a command from the outside, and buffers and decodes the command. The address buffer 115 receives an address from the outside and buffers the address, and the peripheral circuit 116 includes other logic circuits such as a voltage generating circuit and the like. Although not shown in FIG. 3A, memory cell regions may be disposed in the first semiconductor layer LA1, and the peripheral circuit 116 may include a temperature sensing circuit which senses a temperature of the first semiconductor layer LA1 and generates temperature information of the first semiconductor layer LA1.

Each slave chip, e.g., the $n^{th}$ semiconductor layer LAn shown in FIG. 3A, includes a memory region 120 and a logic region 130. The memory region 120 includes wordlines and bitlines for a plurality of memory cells and memory accesses, and the logic region 130 includes a circuit for driving memories, a circuit for generating information related to the $n^{th}$ semiconductor layer LAn, and the like. As shown in FIG. 3B, the logic region 130 can include an input/output driver (IO-DRV) 131, which transmits write data WD to the memory region 120, an input/output sense amplifier (IOSA) 132, which amplifies and outputs read data RD, and a temperature sensor circuit 133 which senses an internal temperature Temp and generates temperature information TQ. The write data WD/read data RD is transmitted outside or to the semiconductor device 100 through a TSV, and the temperature information TQ is transmitted outside the semiconductor device 100 through another TSV.

FIG. 3C is a circuit diagram illustrating the temperature sensor circuit 133 of FIG. 3B, according to an exemplary embodiment. As shown in FIG. 3C, the temperature sensor circuit 133 includes first through third PMOS transistors MP1 through MP3 which are connected to a power supply voltage VDD, and first and second diodes D1 and D2 and first and second resistors R1 and R2 which are connected between the first through third PMOS transistors MP1 through MP3 and a ground voltage. The temperature sensor circuit 133 further includes first and second amplifiers AMP1 and AMP2 and first and second comparators CP1 and CP2. The first amplifier AMP1 differentially amplifies a voltage between nodes of the first and second PMOS transistors MP1 and MP2. The second amplifier AMP2 differentially amplifies a voltage between nodes of the second and third PMOS transistors MP2 and MP3. The first and second comparators CP1 and CP2 compare output voltages of the first and second amplifiers AMP1 and AMP2 and output the comparison results.

The temperature sensor circuit 133 of FIG. 3C is a temperature sensor using a bandgap reference voltage generating circuit and thus generates a reference current using currents I2 and I1, wherein the current I2 flows through the first diode D1, and the current I1 flows through the second diode D2. The reference current is a current corresponding to an output of the first amplifier AMP1. Thus, if a ratio between the first and second diodes D1 and D2 is 1:n, the reference current has a value of $I=kT/q*ln(n)/R2$, wherein k denotes the Boltzmann's constant, T denotes an absolute temperature, and q denotes a quantity of electric charge. Therefore, the reference current has a value that increases in proportion to the absolute temperature T.

A current Ix that flows through the first resistor R1 corresponds to $Ix=V12/R1$, wherein V12 is a voltage applied to both terminals of the first diode D1. The current Ix has an value inversely proportional to the absolute temperature T. The first and second comparators CP1 and CP2 compare output voltages of the first and second amplifiers AMP1 and AMP2 and generate the temperature information TQ indicating whether a temperature of a corresponding semiconductor layer is more than or less than a predetermined reference temperature.

Embodiments of a semiconductor device with a stacked structure for preventing collisions among pieces of information of semiconductor layers when transmitting the pieces of information of the semiconductor layers will now be described. Also, outputs of temperature information generated by sensing temperatures of the semiconductor layers will be described as the pieces of information. However, as described above, the inventive concept is not limited to the temperature information but may apply to information (e.g., chip state information) that is regularly or periodically generated regardless of commands or chip selection signals. Structures of TSVs disclosed hereafter may be applied to the structures of the TSVs shown in FIGS. 2A and 2B, and to TSVs having other different types of structures.

Figure 4:
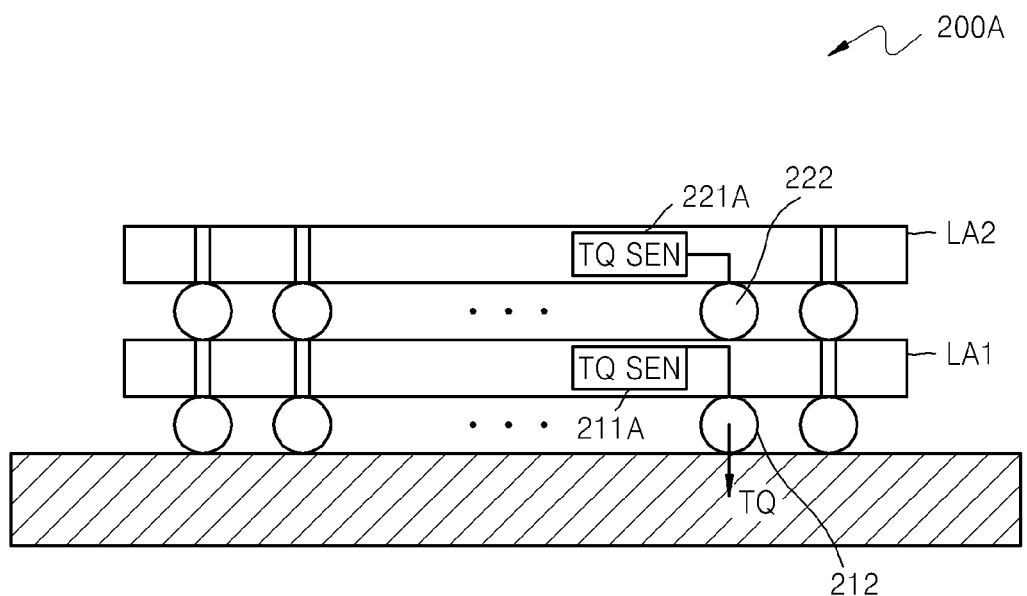
FIG. 4 is a cross-sectional view illustrating an exemplary semiconductor device with a stacked structure, according to another embodiment.

FIG. 4 is a cross-sectional view illustrating an exemplary semiconductor device 200A with a stacked structure, according to another embodiment. As shown in FIG. 4, the semiconductor device 200A includes a plurality of semiconductor layers, e.g., first and second semiconductor layers LA1 and LA2. Each of the first and second semiconductor layers LA1 and LA2 may include a memory region and/or a logic region. In one embodiment, first semiconductor layer LA1 includes both memory regions and control regions (e.g., driver and/or command regions) and serves as a master chip, and second semiconductor layer LA2 includes memory regions but no control regions and therefore serves as a slave chip. However, in another embodiment, both semiconductor layers LA1 and LA2 may include the same memory and/or control regions, such that the two layers include chips having the same circuit layout, or identical chips. The logic regions respectively include first and second temperature sensor circuits 211A and 221A which respectively sense temperatures of the first and second semiconductor layers LA1 and LA2 and generate temperature information TQ.

A plurality of TSVs are formed in each of the first and second semiconductor layers LA1 and LA2. Conductors (e.g., solder balls) are disposed on a surface of each of the first and second semiconductor layers LA1 and LA2, and the conductors disposed on the first semiconductor layer LA1 are connected to a substrate. In one embodiment, the semiconductor device 200A communicates with an external controller (not shown) through the conductors of the first semiconductor layer LA1 and the substrate.

A common output node corresponding to the temperature sensor circuits 211A and 221A is disposed to transmit the temperature information TQ generated by the temperature sensor circuits 211A and 22A to the outside the semiconductor device 200A. For example, a solder ball 212 of the first semiconductor layer LA1 is disposed as the common output node corresponding to the temperature sensor circuits 211A and 221A. According to one embodiment, the solder ball 212 may be fixedly connected to an output of one of the temperature sensor circuits 211A and 221A so that the pieces of temperature information TQ output from the temperature sensor circuits 211A and 221A collide with each other.

Certain output signals of the first and second semiconductor layers LA1 and LA2, e.g., data signals or data strobe signals, may be transmitted through the TSVs. However, in one embodiment, the temperature sensor circuits 211A and 221A generating the temperature information TQ are not electrically connected to the TSVs. Instead, the temperature sensor circuit 221A is electrically connected to a conductor 222 of the second semiconductor layer LA2 through an internal wire, and the temperature sensor circuit 211A is electrically connected to the conductor 212 of the first semiconductor layer LA1 through an internal wire. Since the temperature sensor circuits 211A and 221A are electrically insulated from the TSVs, the temperature information TQ generated by the temperature sensor circuit 221A is not transmitted to the first semiconductor layer LA1. Thus, the temperature information TQ generated by the temperature sensor circuit 211A is fixedly connected to an output node (e.g., the conductor 212 of the first semiconductor layer LA1).

According to the above-described embodiment, the temperature information TQ of one of the plurality of semiconductor layers LA1 and LA2 of the semiconductor device 200A is transmitted to the outside. One piece of information is of the semiconductor layer LA1 and another piece of information is of the semiconductor layer LA2. The external controller (not shown) receives the pieces of temperature information TQ and determines that the temperature information TQ is an internal temperature of the semiconductor device 200A. The external controller may control the semiconductor device 200A according to the determination result. For example, if the semiconductor device 200A is a DRAM, the external controller may control a cycle of a refresh operation performed on a memory region of the DRAM or the like with reference to the temperature information TQ.

Figure 5:
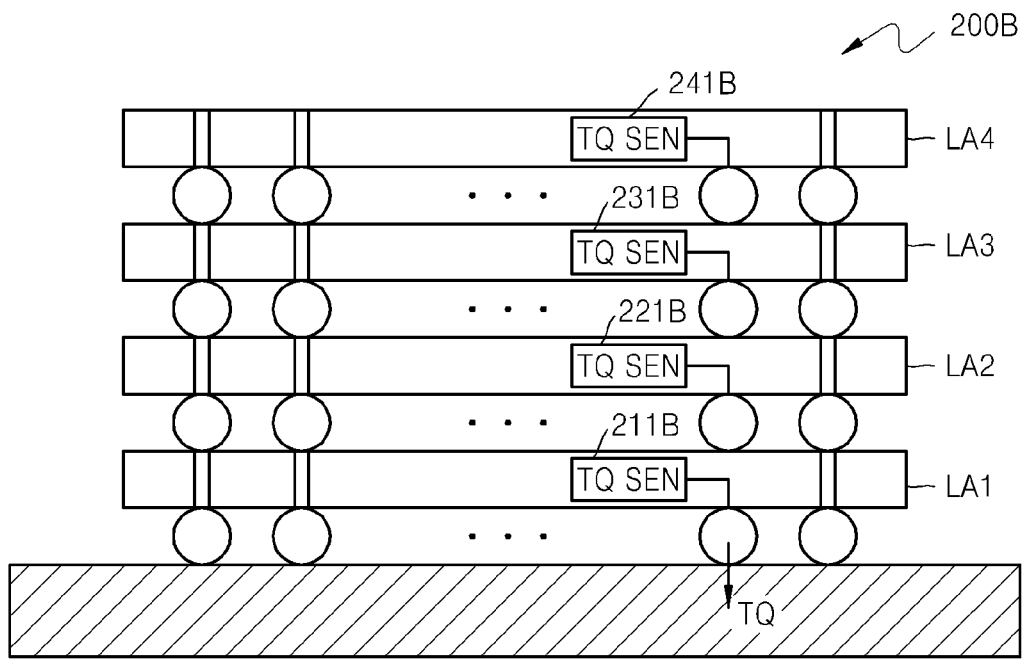
FIG. 5 is a cross-sectional view illustrating an exemplary semiconductor device with a stacked structure, according to another embodiment.

FIG. 5 is a cross-sectional view illustrating an exemplary semiconductor device 200B with a stacked structure, according to another embodiment. The semiconductor device 200B includes first through fourth semiconductor layers LA1 through LA4. Each layer may comprise a memory region and/or a logic region. In one embodiment, first semiconductor layer LA1 includes both memory regions and control regions (e.g., driver and/or command regions) and serves as a master chip, and second through fourth semiconductor layer LA2 to LA4 include memory regions but no control regions and therefore serve as slave chips. In this embodiment, two or more of the second through fourth semiconductor layers LA2 to LA4 may include the same memory and/or control regions, such that the two or more layers include identical chips. As shown in FIG. 5, the first through fourth semiconductor layers LA1 through LA4 respectively include first through fourth temperature sensor circuits 211B through 241B, which respectively sense temperatures of the first through fourth semiconductor layers LA1 through LA4 and generate pieces of temperature information TQ of the first through fourth semiconductor layers LA1 through LA4. TSVs are formed in the first through fourth semiconductor layers LA1 through LA4 and transmit signals among the first through fourth semiconductor layers LA1 through LA4. Since the first through fourth temperature sensor circuits 221B through 241B are electrically insulated from the TSVs, the temperature information TQ is not transmitted among the first through fourth semiconductor layers LA1 through LA4. Therefore, the temperature information TQ generated by the first temperature sensor circuit 211B of the first semiconductor layer LA1 stacked on a surface of a substrate is transmitted to an external controller (not shown) through an internal wire, a conductor, and the substrate.

Figure 6:
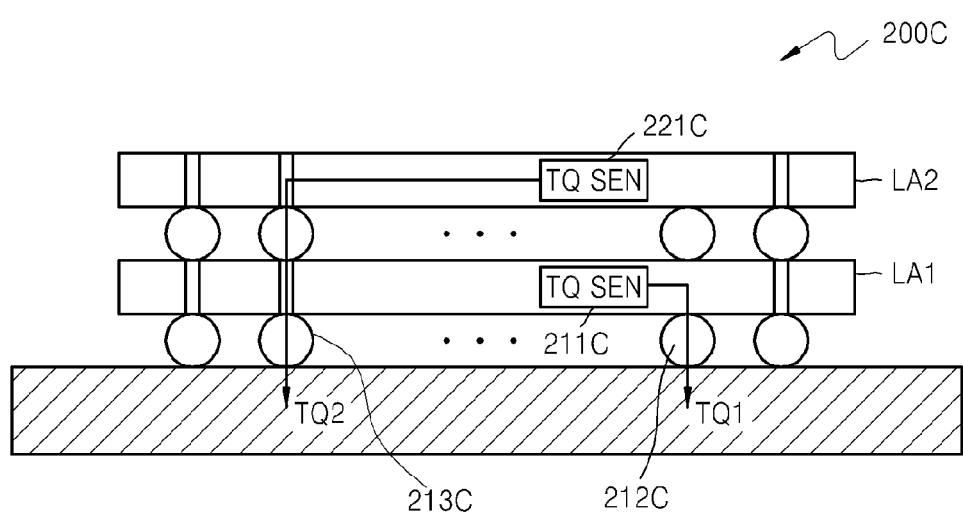
FIG. 6 is a cross-sectional view illustrating an exemplary semiconductor device with a stacked structure, according to one embodiment.

FIG. 6 is a cross-sectional view illustrating an exemplary semiconductor device 200C according to one embodiment. As shown in FIG. 6, the semiconductor device 200C includes a plurality of semiconductor layers, e.g., first and second semiconductor layers LA1 and LA2. TSVs are formed in the first and second semiconductor layers LA1 and LA2, and the first and second semiconductor layers LA1 and LA2 respectively include first and second temperature sensor circuits 211C and 221C.

The semiconductor device 200C includes a plurality of output paths for transmitting pieces of temperature information TQ to the outside, and outputs of the first and second temperature sensor circuits 211C and 221C are respectively connected to different output paths. For example, the first temperature sensor circuit 211C is electrically insulated from the TSV and connected to a conductor 212C (e.g., a solder ball) provided on an outer surface of the first semiconductor layer LA1 through an internal wire, so that a collision between the outputs of the first and second temperature sensor circuits 211C and 221C is prevented. The second temperature sensor circuit 221C is electrically connected to the TSV and thus is connected to an output node 213C provided on the outer surface of the first semiconductor layer LA1 through the TSV. First and second temperature information TQ1 and TQ2 generated from the semiconductor device 200C are transmitted to an external controller (not shown), and the external controller controls the semiconductor device 200C with reference to the first and second temperature information TQ1 and TQ2. As such, at least one TSV is coupled to a first temperature sensor and is configured to receive temperature information from the temperature sensor and pass the temperature information to the outside of the semiconductor device 200C.

A semiconductor device according to another embodiment will now be described with reference to FIGS. 7 through 9.

Figure 7:
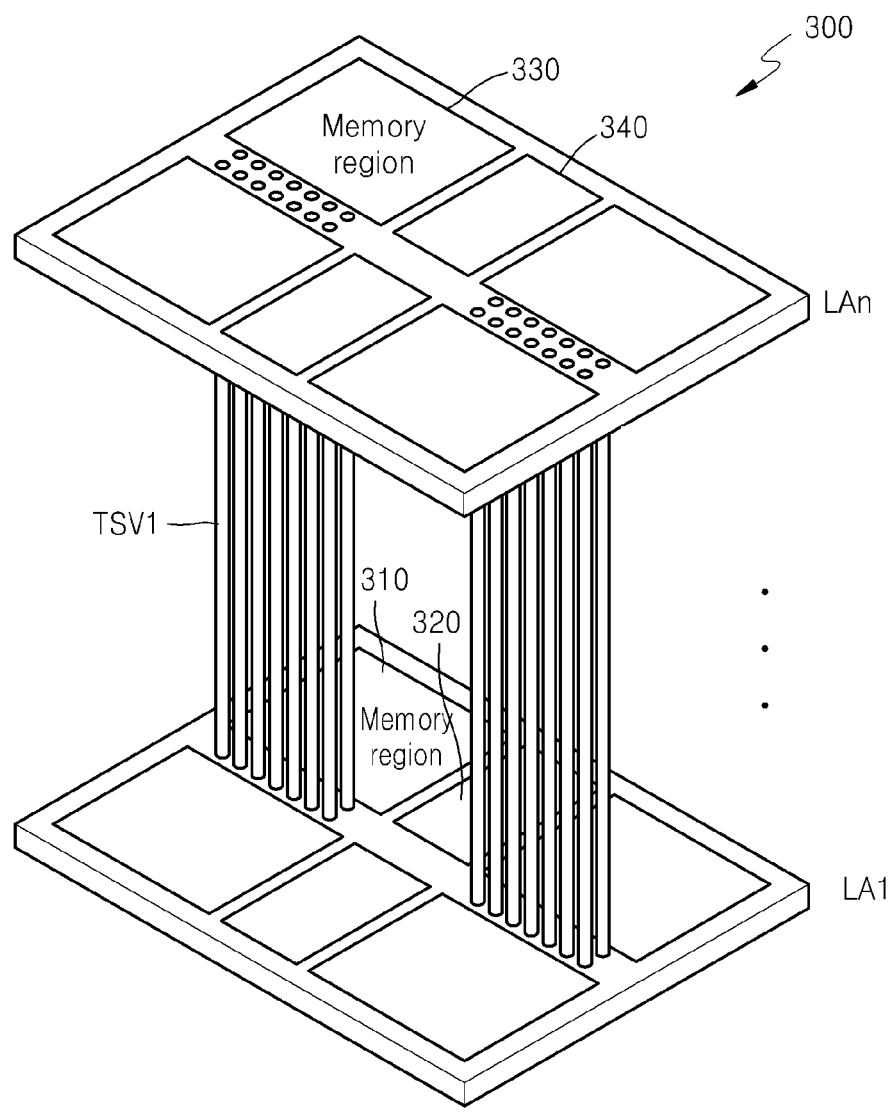
FIG. 7 is a perspective view illustrating an exemplary semiconductor device using a fuse unit according to one embodiment.

FIG. 7 is a perspective view illustrating an exemplary semiconductor device 300 according to another embodiment. As shown in FIG. 7, the semiconductor device 300 includes a plurality of semiconductor layers, i.e., first through $n^{th}$ semiconductor layers LA1 through LAn. In the embodiment of FIG. 7, all the first through $n^{th}$ semiconductor layers LA1 through LAn may be identical memory chips. However, alternatively, the first through $n^{th}$ semiconductor layers LA1 through LAn may be a master chip and slave chips. If the first semiconductor layer LA1 is a master chip, a circuit for interfacing with the outside and various types of logic circuits for controlling memory operations may be disposed in the first semiconductor layer LA1.

Each of the first through $n^{th}$ semiconductor layers LA1 through LAn includes a memory region and a logic region. For example, the first semiconductor layer LA1 includes a memory region 310 and a logic region 320, and the $n^{th}$ semiconductor layer LAn includes a memory region 330 and a logic region 340. The first through $n^{th}$ semiconductor layers LA1 through LAn transmit and/or receive signals to and/or from one another through TSVs.

In the embodiment of FIG. 7, the logic regions 320 and 340 of each of the first through $n^{th}$ semiconductor layers LA1 through LAn include temperature sensor circuits (not shown), and temperature information generated by the temperature sensor circuits is transmitted through a common output path. For example, the temperature information is transmitted through an output path including first TSVs TSV1. The first TSVs TSV1 may be vias which are respectively formed in the first through n$^{th}$ semiconductor layers LA1 through LAn and aligned in the same positions. If the first semiconductor layer LA1 is stacked on a substrate (not shown), temperature information of the other semiconductor layers, namely, the second through nth semiconductor layers LA2 through LAn, is transmitted to the first semiconductor layer LA1 through the first TSVs TSV1. The temperature information transmitted to the first semiconductor layer LA1 is transmitted to the outside through an output node disposed on an outer surface of the first semiconductor layer LA1.

FIGS. 8A and 8B are block diagrams illustrating an exemplary part of the logic region 340 of the semiconductor device 300 of FIG. 7, according to certain embodiments. A part of the logic region 340 of the n$^{th}$ semiconductor layer LAn of FIG. 7 is shown in FIGS. 8A and 8B, but logic regions of the other semiconductor layers may also include the same features as shown in FIGS. 8A and 8B.

As shown in FIG. 8A, the logic region 340 includes a temperature sensor circuit 341, which senses a temperature of the n$^{th}$ semiconductor layer LAn and generates temperature information TQ. The temperature sensor circuit 341 transmits the temperature information TQ to a TSV TSV1 through an output unit such as a buffer. For example, if an output of the temperature sensor circuit 341 is connected to a TSV of the n$^{th}$ semiconductor layer LAn and transmitted, the TSV TSV1 of FIG. 8A may be a via formed in the n$^{th}$ semiconductor layer LAn. Alternatively, if the output of the temperature sensor circuit 341 is electrically connected to the n−1$^1$ semiconductor layer positioned underneath the n$^{th}$ semiconductor layer LAn through a conductor disposed on an outer surface of the n$^{th}$ semiconductor layer LAn, the TSV TSV1 may be a via formed in the n−1$^{th}$ semiconductor layer.

The temperature information TQ transmitted to the TSV TSV1 is transmitted outside the semiconductor device 300 through other lower semiconductor layers. The logic region 340 further includes a controller for controlling whether the temperature information TQ is to be output, e.g., by using a fuse unit 342, which generates a signal for controlling an output buffer. In general, fuses of the fuse unit 342 may include an electric fuse that is disconnected according to an electric signal and a laser fuse which is disconnected by a laser irradiated on a wafer level when manufacturing a semiconductor device. In the embodiments of FIGS. 8A and 8B, the fuse unit 342 is a laser fuse that is disconnected by an irradiated laser.

When manufacturing the semiconductor device 300, a laser is irradiated onto the fuse unit 342 on a wafer level of each of the first through n$^{th}$ semiconductor layers LA1 through LAn, thereby setting a connection state of a fuse. A laser may be irradiated onto the fuse unit 342 of one of the first through n$^{th}$ semiconductor layers LA1 through LAn to set a connection state of the fuse unit 342 to a first state, so that a collision between the temperature information TQ of two adjacent semiconductor layers is prevented from occurring on a common output path. Lasers may be irradiated onto the fuse units 342 of the other semiconductor layers to set connection states of the fuse units 342 to second states. The fuse unit 342 generates a signal for enabling an output buffer in the first state, and the fuse unit 342 generates signals for disabling the output buffer in the second states. Therefore, an output of the temperature sensor circuit 341 of one of the first through n$^{th}$ semiconductor layers LA1 through LAn is enabled and thus fixedly connected to the TSV TSV1, and the temperature information TQ transmitted to the TSV TSV1 is transmitted to the outside. Outputs of temperature sensor circuits 341 of the other semiconductor layers are disabled.

FIG. 8B is a block diagram illustrating the logic region 340 of the semiconductor device, according to another exemplary embodiment. As shown in FIG. 8B, the logic region 340 includes a temperature sensor circuit 341, a sensor controller 343 which controls enabling of the temperature sensor circuit 341, and a fuse unit 342 which generates a signal for controlling the sensor controller 343. Differently from FIG. 8A, in FIG. 8B, enabling of an output buffer that outputs temperature information TQ is not controlled, but an operation of the temperature sensor circuit 341 is enabled or disabled, thereby preventing a collision between temperature information TQ of the first through n$^{th}$ semiconductor layers LA1 through LAn.

On a wafer level of each of the first through n$^{th}$ semiconductor layers LA1 through LAn, a laser is irradiated onto the fuse unit 342 to set a connection state of the fuse unit 342 to a first state or a second state. For example, a connection state of the fuse unit 342 of one of the first through n$^{th}$ semiconductor layers LA1 through LAn may be set to a first state, and connection states of fuse units 342 of the other semiconductor layers may be set to second states.

For example, under the control of the fuse unit 342 in the first state, the sensor controller 343 generates an enable signal EN for enabling the temperature sensor circuit 341 and transmits the enable signal EN to the temperature sensor circuit 341. Under the control of the fuse unit 342 in the second state, the sensor controller 343 generates a disable signal for disabling the temperature sensor circuit 341 and transmits the disable signal to the temperature sensor circuit 341. Therefore, an output of the temperature sensor circuit 341 of one of the first through n$^{th}$ semiconductor layers LA1 through LAn is enabled and thus fixedly connected to a TSV TSV1, and temperature information TQ transmitted to the TSV TSV1 is transmitted to the outside.

Figure 9:
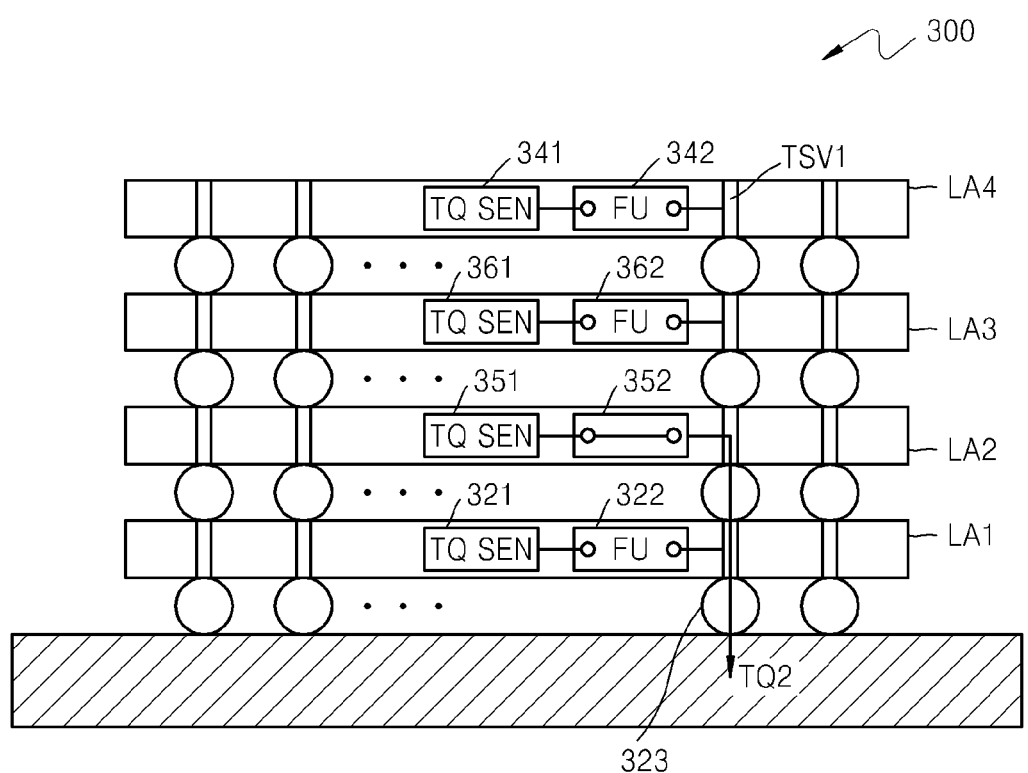
FIG. 9 is a cross-sectional view illustrating an exemplary output state of temperature information of the semiconductor device of FIG. 7, according to one embodiment.

FIG. 9 is a cross-sectional view illustrating an exemplary output state of temperature information of the semiconductor device 300 of FIG. 7, according to one embodiment. As shown in FIG. 9, the semiconductor device 300 includes a plurality of semiconductor layers, e.g., first through fourth semiconductor layers LA1 through LA4, which respectively include temperature sensor circuits 321, 351, 361, and 341, and fuse units 322, 352, 362, and 342. Connection states of the fuse units 322, 352, 362, and 342 are respectively set to first or second states by lasers irradiated on wafer levels of the first through fourth semiconductor layers LA1 through LA4 or electrical signals transmitted to the first through fourth semiconductor layers LA1 through LA4.

In the embodiment of FIG. 9, an output of the temperature sensor circuit 351 of the second semiconductor layer LA2 is fixedly connected to a TSV TSV1. Therefore, the connection state of the fuse unit 352 of the second semiconductor layer LA2 is set to a first state, and the connection states of the fuse units 322, 362, and 342 of the other first, third, and fourth semiconductor layers LA1, LA3, and LA4 are set to second states. The output (temperature information TQ2) of the temperature sensor circuit 351 of the second semiconductor layer LA2 is transmitted to the outside through the TSV TSV1 and an output node 323 (e.g., a conductor such as a solder ball) formed on an outer surface of the first semiconductor layer LA1. As such, the fuse units permit a sensed temperature of a particular semiconductor chip to be selected and output to the outside of the semiconductor device (e.g., to a controller).

Semiconductor devices according to additional exemplary embodiments will now be described with reference to FIGS. 10 and 11.

Figure 10:
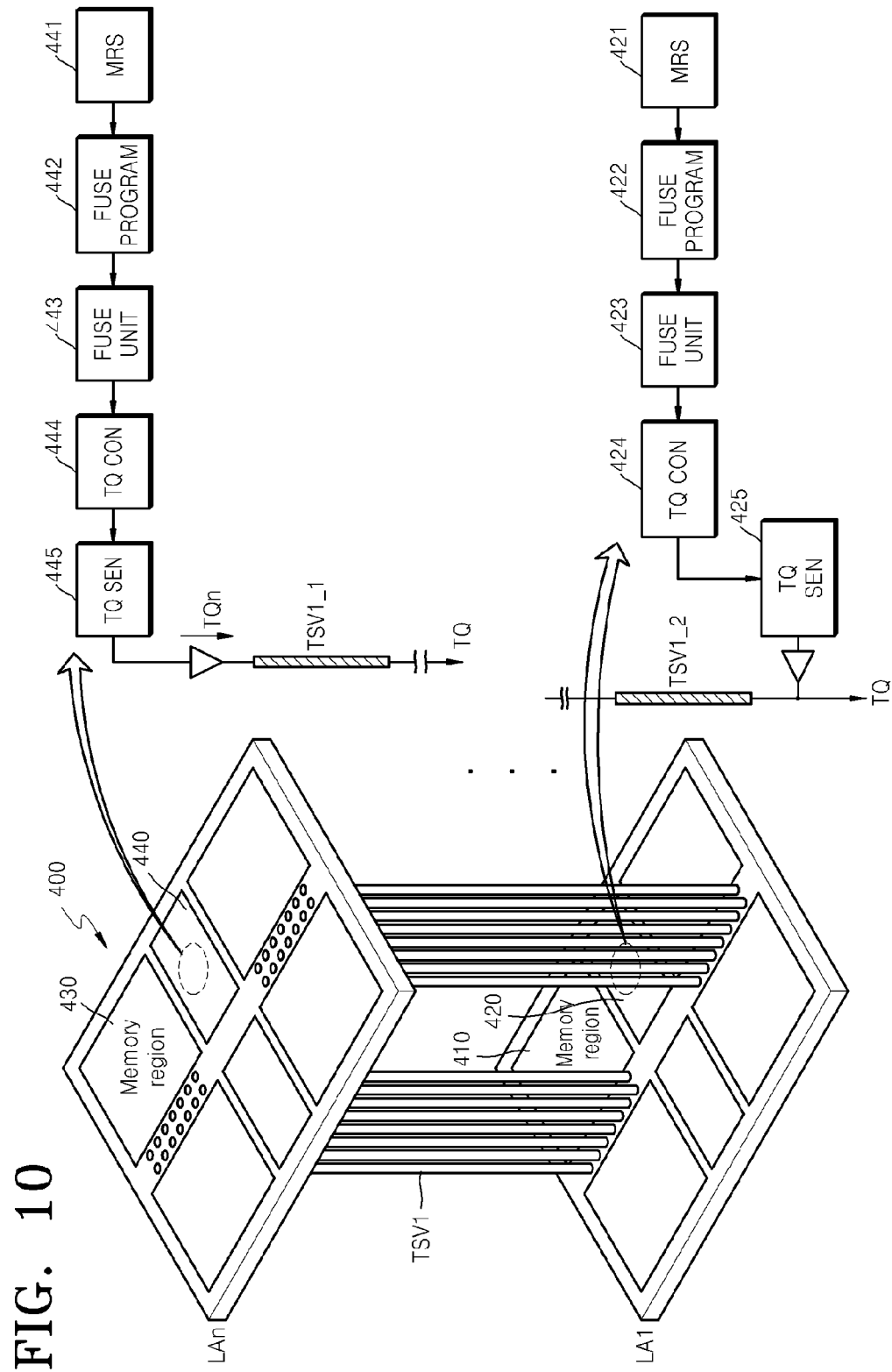
FIG. 10 illustrates an exemplary structure of a semiconductor device using a fuse unit, according to another embodiment.

As shown in FIG. 10, a semiconductor device 400 includes a plurality of semiconductor layers, e.g., first through nth semiconductor layers LA1 through LAn. The plurality of first through nth semiconductor layers LA1 through LAn included in the semiconductor device 400 of FIG. 10 may all include memory regions and may be memory chips which are identical, as in the exemplary semiconductor device 300 of FIG. 7. The plurality of first through nth semiconductor layers LA1 through LAn may each include memory regions 410 and 430 and logic regions 420 and 440.

In the semiconductor device 400 of FIG. 10, an operation of a temperature sensor circuit is controlled by electrical fuses and a mode register set (MRS) code as a type of command. The logic region 420 of the first semiconductor layer LA1 includes an MRS unit 421 that generates the MRS code in an initial operation of the semiconductor device 400 and thus sets an operation environment of the semiconductor device 400, a fuse programming unit 422 that receives the MRS code and controls program of the electrical fuse, a fuse unit 423 including at least one electrical fuse, a sensor controller 424, and a temperature sensor circuit 425. Also, the nth semiconductor layer LAn may include a MRS unit 441, a fuse programming unit 442, a fuse unit 443, a sensor controller 444, and a temperature sensor circuit 445. Operation related to temperature information output with reference to the first semiconductor layer LA1 in one embodiment is described as follows.

Codes related to temperature information output are previously set and stored in the MRS 421, and the MRS codes generated from the MRS 421 in an initial operation of the semiconductor device 400 are provided to the fuse programming unit 422. The fuse programming unit 422 generates control signals for controlling a connection state of the electrical fuse in response to the received MRS codes. A connection state of the fuse unit 423 is set to a first state or a second state in response to the control signals. In one embodiment, due to the MRS codes, a connection state of a fuse unit of one of the first through nth semiconductor layers LA1 through LAn is set to a first state, and connection states of fuse units of the other semiconductor layers are set to second states. For example, if the connection state of the fuse unit 443 of the nth semiconductor layer LAn is set to a first state, a signal generated according to the first state is transmitted to the sensor controller 444. The sensor controller 444 generates an enable signal in response to the signal and transmits the enable signal to the temperature sensor circuit 445, and the temperature sensor circuit 445 generates temperature information TQn and transmits the temperature information TQn to the outside through TSVs TSV1_1 and TSV1_2. When the semiconductor device 400 is operating, temperature information TQn of the nth semiconductor layer LAn is fixedly connected to an output path including the TSVs TSV1_1 and TSV1_2, and temperature information of the other semiconductor layers is disabled.

In the above-described embodiment, when the semiconductor device 400 is operating, temperature information of one semiconductor layer is fixedly transmitted to the outside. However, a selection of a semiconductor layer that provides temperature information is possible. For example, register states of the MRS 421 and the MRS 441 may be adjusted to be set differently. For example, if an internal temperature of the first semiconductor layer LA1 is the highest, and thus a refresh cycle is to be executed based on the internal temperature of the first semiconductor layer LA1, the register states of the MRS 421 and the MRS 441 may be set differently, thereby transmitting the internal temperature of the first semiconductor layer LA1 to the outside.

Figure 11:
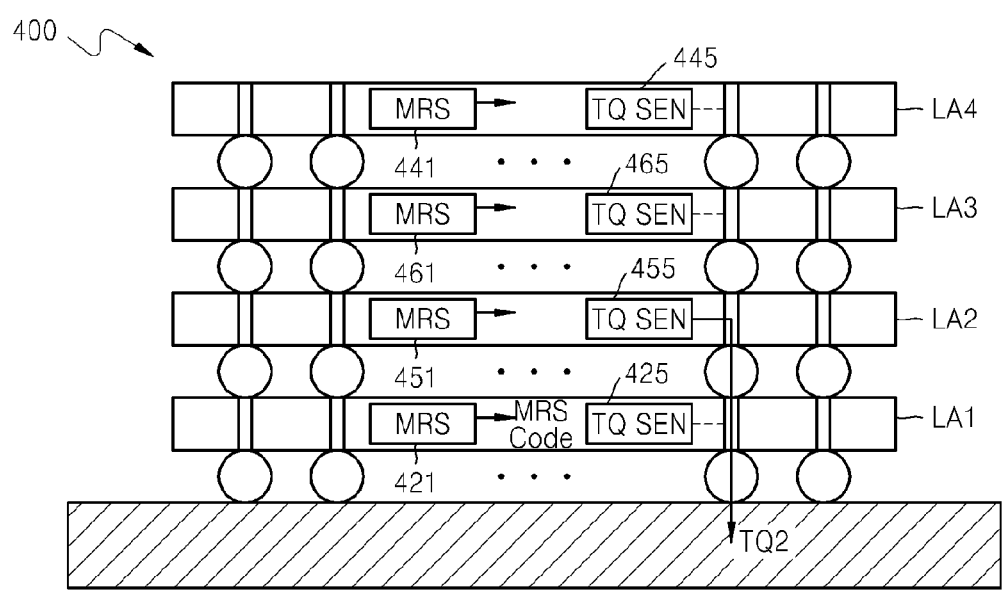
FIG. 11 is a cross-sectional view illustrating an exemplary output state of temperature information of the semiconductor device of FIG. 10, according to one embodiment.

FIG. 11 is a cross-sectional view illustrating exemplary output states of temperature information of the semiconductor device 400 of FIG. 10, according to certain embodiments. As shown in FIG. 11, the MRSs 421, 451, 461, and 441 of the first through fourth semiconductor layers LA1 through LA4 generate MRS codes for respectively setting operation environments of the first through fourth semiconductor layers LA1 through LA4. The MRSs generate an MRS code for setting outputs of temperature sensor circuits 425, 455, 465, and 445. In the embodiment shown in FIG. 11, temperature information TQ2 of the second semiconductor layer LA2 is transmitted outside the semiconductor device 400 in response to the MRS code, and outputs of temperature information of the other semiconductor layers, namely, the first, third, and fourth semiconductor layers LA1, LA3, and LA4, are disabled.

Semiconductor devices according to additional exemplary embodiments will now be described with reference to FIGS. 12 through 15.

Figure 12:
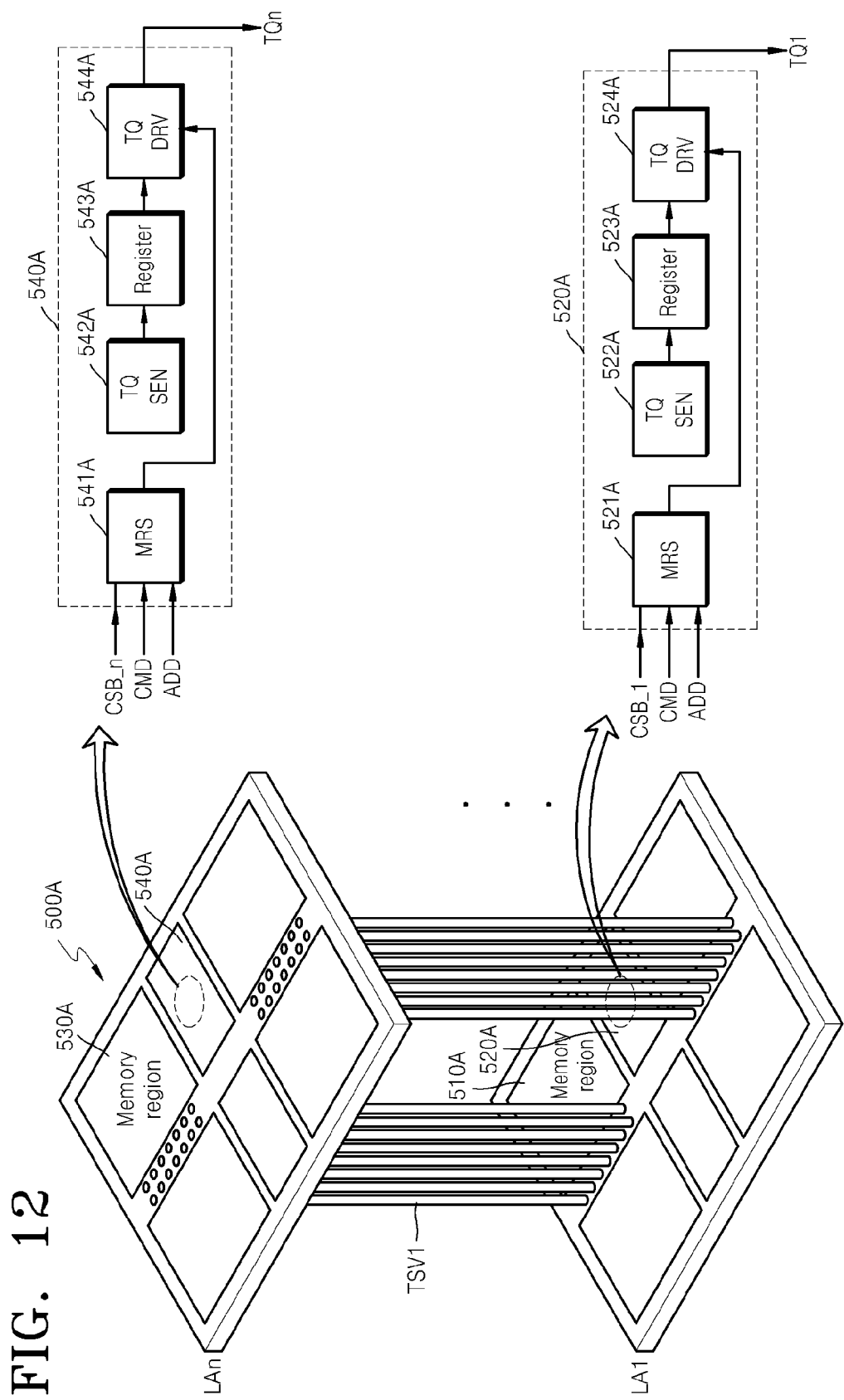
FIG. 12 illustrates an exemplary structure of a semiconductor device using a command signal, according to one embodiment.

FIG. 12 illustrates an exemplary structure of a semiconductor device 500A according to another embodiment. As shown in FIG. 12, the semiconductor device 500A includes a plurality of semiconductor layers, e.g., first through nth semiconductor layers LA1 through LAn. In one embodiment, all the first through nth semiconductor layers LA1 through LAn may be memory chips and may be identical.

In the embodiment of FIG. 12, logic regions 520A and 540A of the first through nth semiconductor layers LA1 through LAn respectively include temperature sensor circuits 522A and 542A, and temperature information TQ1 and TQn respectively generated by the temperature sensor circuits 522A and 542A is transmitted through a common output path. For example, the temperature information TQ1 and TQn of the first through nth semiconductor layers LA1 through LAn is transmitted through a common TSV TSV1 of the semiconductor device 500A.

In this embodiment, an output of a temperature sensor circuit of one semiconductor layer is not fixedly connected to an output path, but outputs of the temperature sensor circuits 522A and 542A of the first through nth semiconductor layers LA1 through LAn are selectively connected to the output path. As a method of selectively connecting the outputs of the temperature sensor circuits 522A and 542A to the output path, the temperature sensor circuits 522A and 542A operate in response to a command CMD and/or an address ADD.

As shown in FIG. 12, the logic region 520A of the first semiconductor layer LA1 may include a MRS 521A, the temperature sensor circuit 522A, a register 523A, and a temperature information output unit 524A. Also, the other semiconductor layer, e.g., the nth semiconductor layer LAn, may include a MRS 541A, the temperature sensor circuit 542A, a register 543A, and a temperature information output unit 544A. Outputs of the temperature information output units 524A and 544A may be controlled by a predetermined control signal, and the temperature information output units 524A and 544A may include, for example, a switch or a tri-state buffer. An exemplary operation of the semiconductor device 500A is described as follows with reference to the nth semiconductor layer LAn.

A chip selection signal CSB_n for chip selection and a command/address CMD/ADD are provided to the nth semiconductor layer LAn. The nth semiconductor layer LAn is selected by the chip selection signal CSB_n, and the MRS 541A receives the command CMD and/or the address ADD and generates a control signal (for example, an MRS signal) in response to the command CMD and/or the address ADD. Codes used to read temperature information are previously set and stored in the MRS 541A, and an external controller (not illustrated) provides the chip selection signal CSB_n used to read temperature information, the command CMD and/or the address ADD to the semiconductor device 500A.

When a temperature information reading command is received from the outside, the MRS 541A provides a control signal to the temperature information output unit 544A in response to the temperature information reading command. The temperature information TQn from the temperature sensor circuit 542A is temporarily stored in the register 543A and is provided to the outside through the TSVs TSV1 based on switching operation of the temperature information output unit 544A. In FIG. 12, it is illustrated that the temperature information output unit 544A is controlled by the control signal from the MRS 541A. However, as described in the previous embodiment, the nth semiconductor layer LAn may further include a sensor controller (not illustrated) for controlling activation of the temperature sensor circuit 542A. Also, the control signal from the MRS 541A may be provided to the sensor controller (not illustrated).

A combination of the command CMD and/or the address ADD for reading temperature information of the semiconductor device 500A may be arbitrarily set. For example, codes for controlling the temperature information output units 524A and 544A are set in the MRS 521A and 541A, and the MRS 521A and the MRS 541A generate control signals for controlling the temperature information output units 524A and 544A in response to the command CMD from the outside. Any one of combinations of various signals (command signals such as RAS, CAS, and WE) may be used as the command CMD, and a general reading command for reading data may be used to output temperature information. When reading the temperature information, any one semiconductor layer is selected by chip selection signals CSB_1 and CSB_n from the outside, and MRS of the selected semiconductor layer generates a control signal for controlling the temperature information output unit in response to the reading command. According to states of the chip selection signals CSB_1 and CSB_n, the temperature information from any one of the first through nth semiconductor layers LA1 through LAn is provided to the outside.

Figure 13:
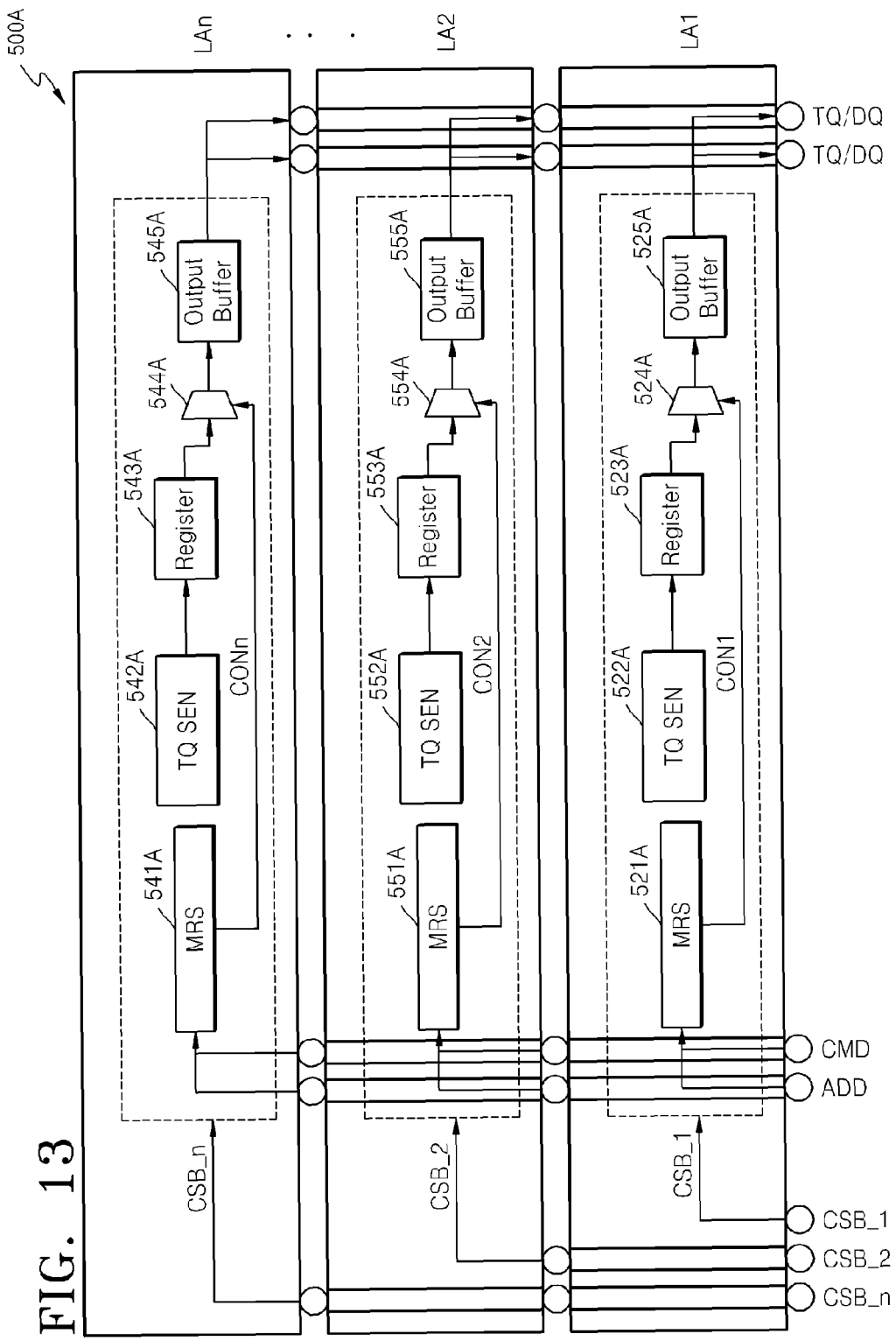
FIG. 13 is a block diagram illustrating exemplary transmission paths of a command signal and temperature information of the semiconductor device of FIG. 12, according to one embodiment.

FIG. 13 is a block diagram illustrating exemplary transmission paths of a command and temperature information of the semiconductor device 500A of FIG. 12, according to one embodiment.

The first through nth semiconductor layers LA1 through LAn respectively include MRSs 521A, 551A, and 541A, temperature sensor circuits 522A, 552A, and 542A, registers 523A, 553A, and 543A, and temperature information output units 524A, 554A, and 544A. In addition, as illustrated in FIG. 13, the first through nth semiconductor layers LA1 through LAn may respectively include output buffers 525A, 555A, and 545A. In FIG. 13, data DQ and temperature information TQ of each of the first through nth semiconductor layers LA1 through LAn may be provided to the outside through a common path (for example, common TSV). An exemplary operation of the semiconductor device 500A is described as follows with reference to the nth semiconductor layer LAn.

Chip selection signals CSB_1, CSB_2, and CSB_n may be provided through separate paths according to the semiconductor layers. For example, when the nth semiconductor layer LAn is selected by the chip selection signals CSB_1, CSB_2, and CSB_n, the MRS 541A of the nth semiconductor layer LAn generates a control signal CONn for controlling the temperature information output unit 544A in response to the command CMD and/or the address ADD from the outside. The temperature information TQ from the temperature sensor circuit 542A is provided to the temperature information output unit 544A through the register 543A, and the temperature information output unit 544A provides the temperature information TQ to the output buffer 545A in response to the control signal CONn. The temperature information TQ is provided to the outside through the output buffer 545A and a TSV. The TSV may be part of a stack of through substrate vias vertically aligned with each other and electrically connected to each other to allow signals to be passed through the different semiconductor layers. In one embodiment, they may connect to each other through conductors, such as solder balls. As such, each stack of electrically connected through substrate vias may be considered a node.

When the temperature information TQ and the data DQ shares an output path, the output buffer 545A further receives data (for example, output data DQ) in the nth semiconductor layer LAn, in addition to the temperature information TQ. Before the temperature information TQ is provided to the outside, the MRS 541A may generate MRS codes for blocking transmission paths (not illustrated) of the data DQ in response to the command CMD and/or the address ADD. The data DQ may not be provided to the output buffer 545A under control of the MRS codes. The command CMD and/or the address ADD for blocking the transmission paths (not illustrated) of the data DQ may have a first combination, and the command CMD and/or the address ADD for controlling the temperature information output unit 544A may have a second combination. Furthermore, the MRS codes may prevent the other layers LA1 through LAn−1 from outputting data to the stack of through substrate vias, to avoid data collisions.

Figure 14:
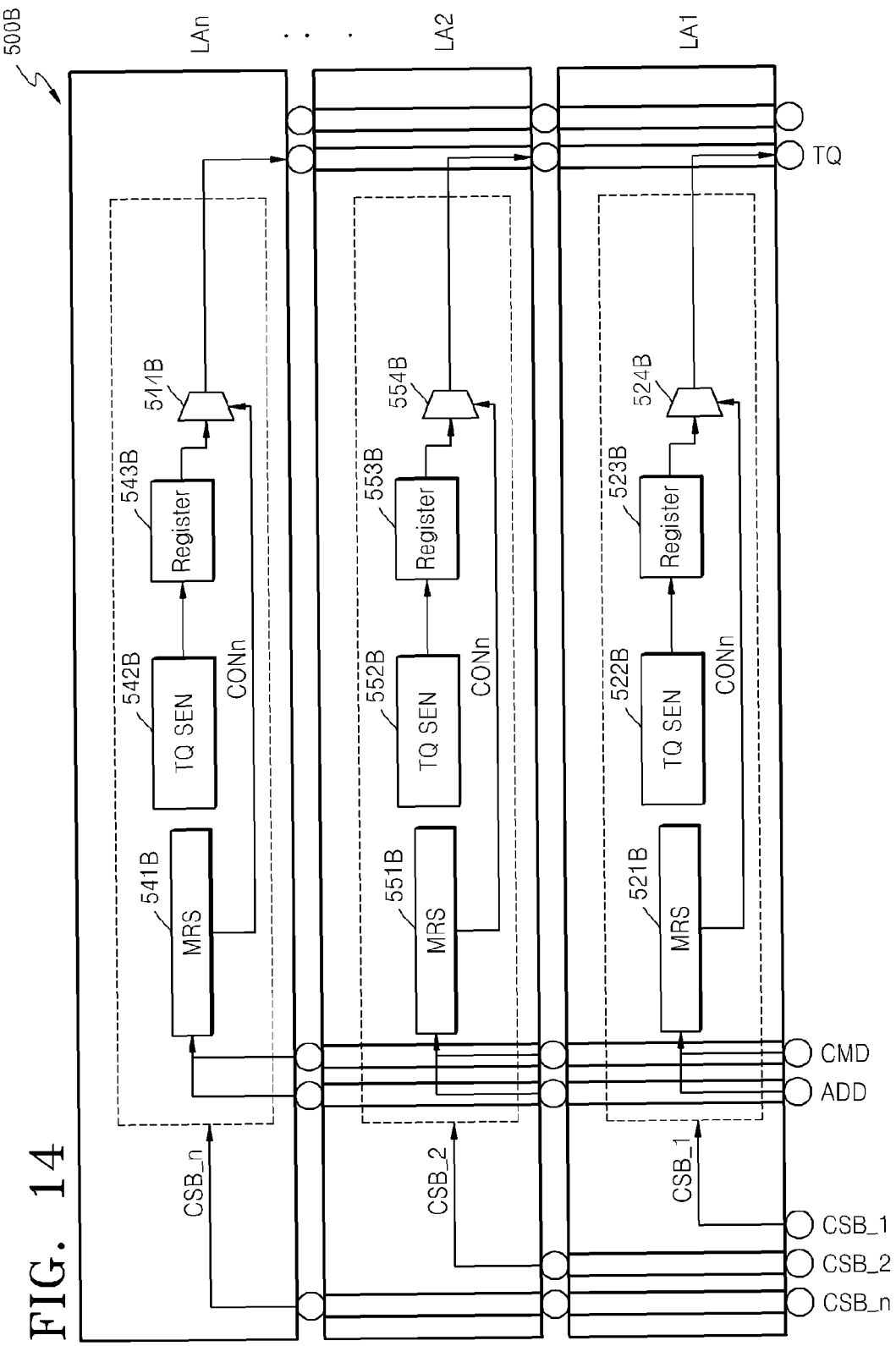
FIG. 14 is a cross-sectional view illustrating output states of temperature information of the semiconductor device of FIG. 12, according to certain embodiments.

FIG. 14 is a cross-sectional view illustrating exemplary output states of temperature information of the semiconductor device 500A of FIG. 12, according to another embodiment. In FIG. 14, the temperature information TQ and the data DQ are each output through a different path.

As illustrated in FIG. 14, a semiconductor device 500B includes the first through nth semiconductor layers LA1 through LAn, and the first through nth semiconductor layers LA1 through LAn respectively include MRSs 521B, 551B, and 541B, temperature sensor circuits 522B, 552B, and 542B, registers 523B, 553B, and 543B, and temperature information output units 524B, 554B, and 544B. Since the temperature information TQ and the data DQ are each output through a different path, the temperature information TQ from the temperature sensor circuits 522B, 542B, and 552B may be transmitted to a TSV through the temperature information output units 524B, 544B, and 554B.

When the nth semiconductor layer LAn is selected by the chip selection signals CSB_1, CSB_2, and CSB_n, the MRS 541B of the nth semiconductor layer LAn generates a control signal CONn for controlling the switching unit 544B in response to the command CMD and/or the address ADD from the outside. Also, the temperature information TQ from the temperature sensor circuit 542B is provided to the temperature information output unit 544B through the register 543B and is provided to the outside through the TSV. In one embodiment, when one semiconductor layer is selected for reading or recording data, the temperature information TQ of the corresponding semiconductor layer is provided to the outside, and the data and the temperature information TQ are provided to the outside through a separate path when reading data.

Figure 15:
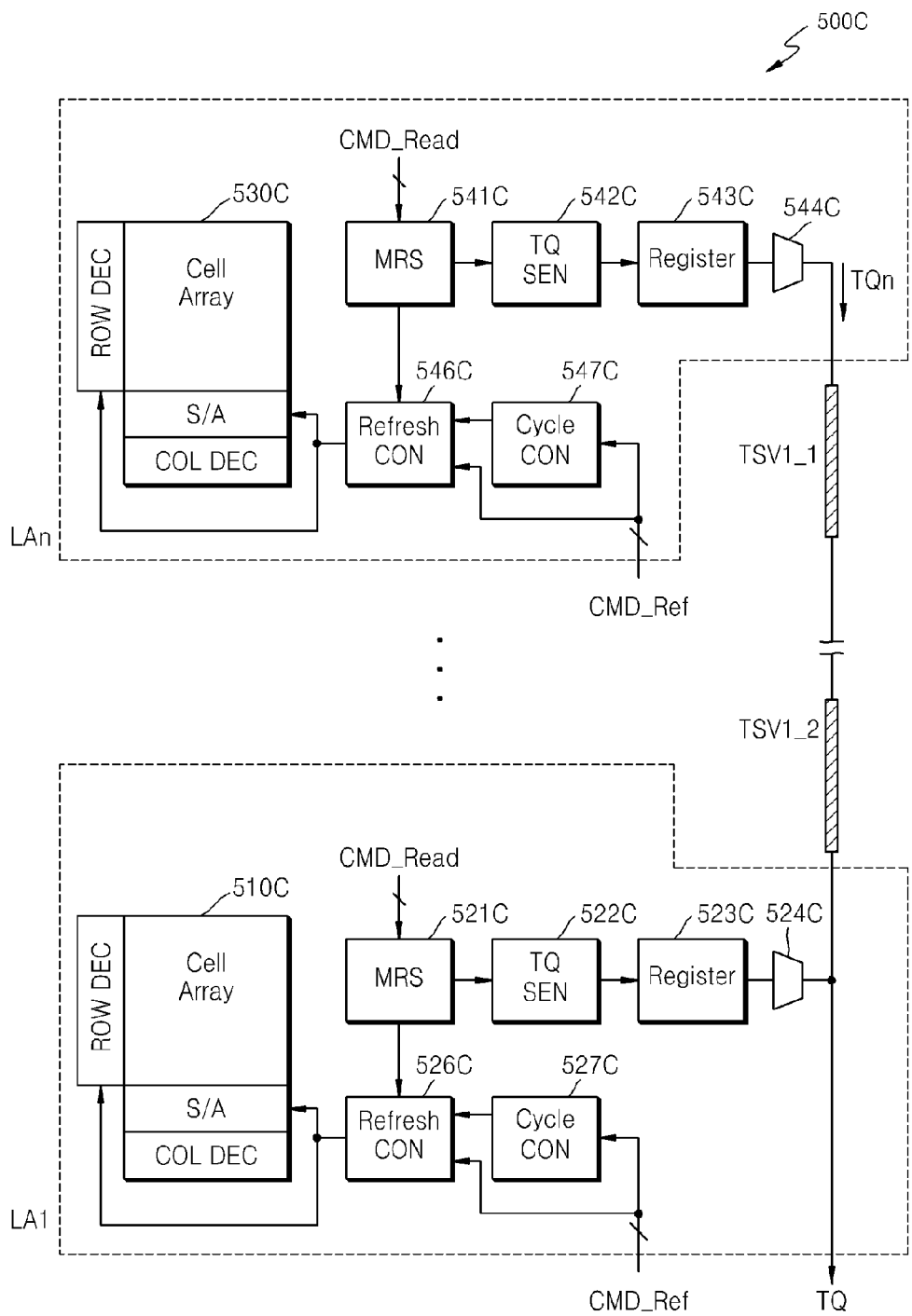
FIG. 15 is a block diagram illustrating exemplary operations of generating temperature information and controlling a refresh cycle in the semiconductor device of FIG. 12, according to certain embodiments.

FIG. 15 is a block diagram illustrating exemplary operations of generating temperature information and controlling a refresh cycle in the semiconductor device 500A of FIG. 12, according to certain embodiments. As shown in FIG. 15, a semiconductor device 500C includes a plurality of semiconductor layers, but first and nth semiconductor layers LA1 and LAn will be exemplarily described herein for convenience. The first and nth semiconductor layers LA1 and LAn may have the same configuration (e.g., same circuit layout) in the semiconductor device 500C.

The first semiconductor layer LA1 includes a memory region 510C and a plurality of circuits. For example, the first semiconductor layer LA1 may include, in relation to reading of temperature information TQ, a MRS 521C, a temperature sensor circuit 522C, a register 523C, and a temperature information output unit 524C, and in relation to a refresh operation, a refresh controller 526C and a cycle controller 527C. The memory region 510C includes a cell array, a row decoder, a column decoder, a sense amplifier, and the like. The nth semiconductor layer LAn also includes a memory region 530C, a MRS 541C, a temperature sensor circuit 542C, a register 543C, a temperature information output unit 544C, a refresh controller 546C, and a cycle controller 547C.

When the nth semiconductor layer LAn is selected, temperature information TQn generated by the temperature sensor circuit 542C of the nth semiconductor layer LAn is transmitted to the outside through first TSVs TSV1_1 and TSV1_2 in response to a command CMD_Read for reading temperature information. Then, a refresh command CMD_Ref related to a refresh operation or refresh cycle is received from an external controller (not shown), and the refresh operation and a control operation of a refresh cycle are performed in response to the refresh command CMD_Ref. For example, the refresh controller 546C of the nth semiconductor layer LAn generates a refresh signal in response to the refresh command CMD_Ref and provides the refresh signal to the memory region 530C. Also, the cycle controller 547C generates a cycle control signal in response to the refresh command CMD_Ref and provides the cycle control signal to the refresh controller 546C. As described above, since temperature information of each of the plurality of first through nth semiconductor layers LA1 through LAn is provided to the outside and thus the external controller (not illustrated) may control the first through nth semiconductor layers LA1 through LAn to each have different refresh cycles with reference to the temperature information.

A semiconductor device according to other exemplary embodiments will now be described with reference to FIGS. 16 through 19.

Figure 16:
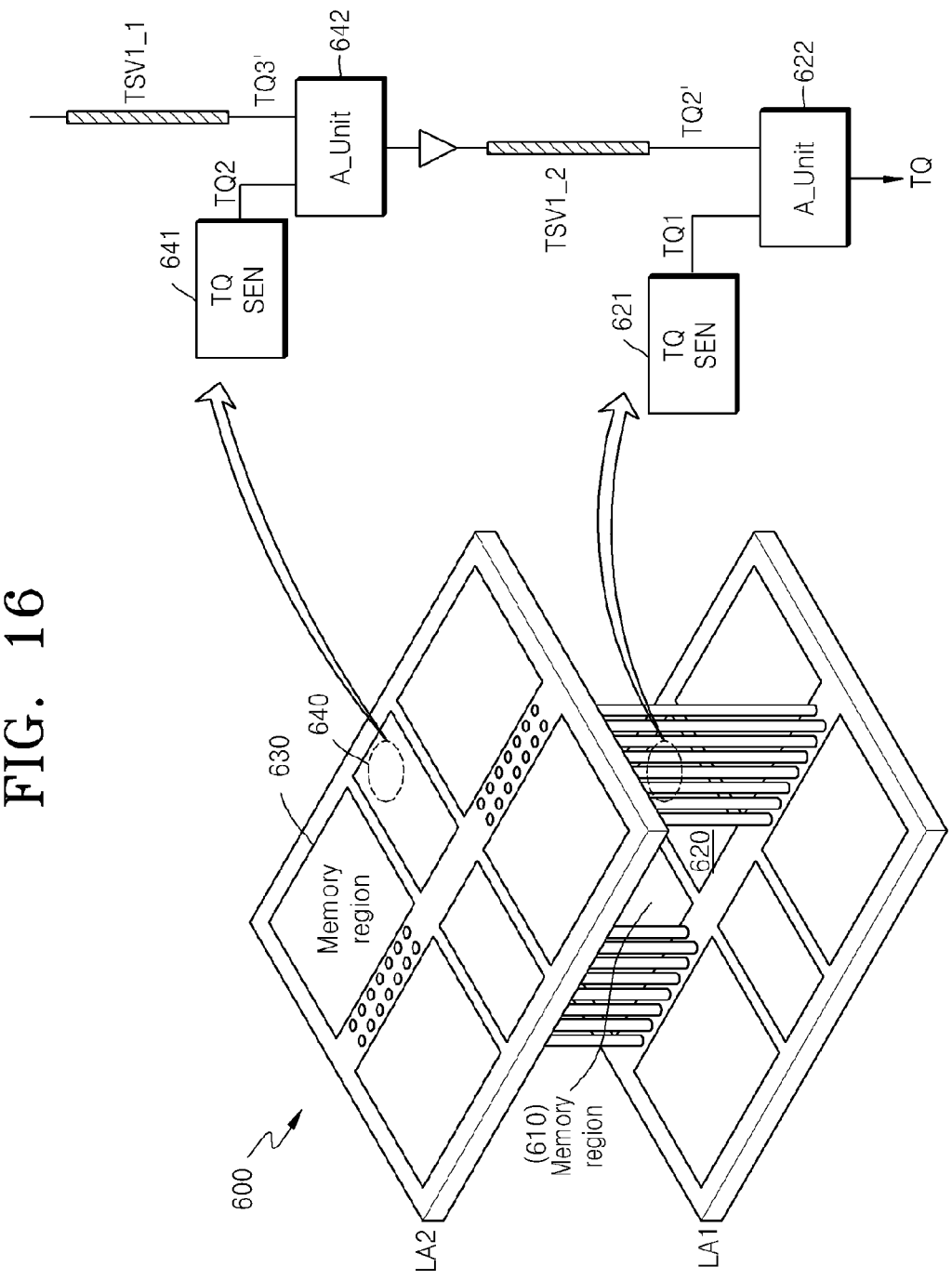
FIG. 16 illustrates an exemplary structure of a semiconductor device using an algorithm unit according to one embodiment.
Figure 17:
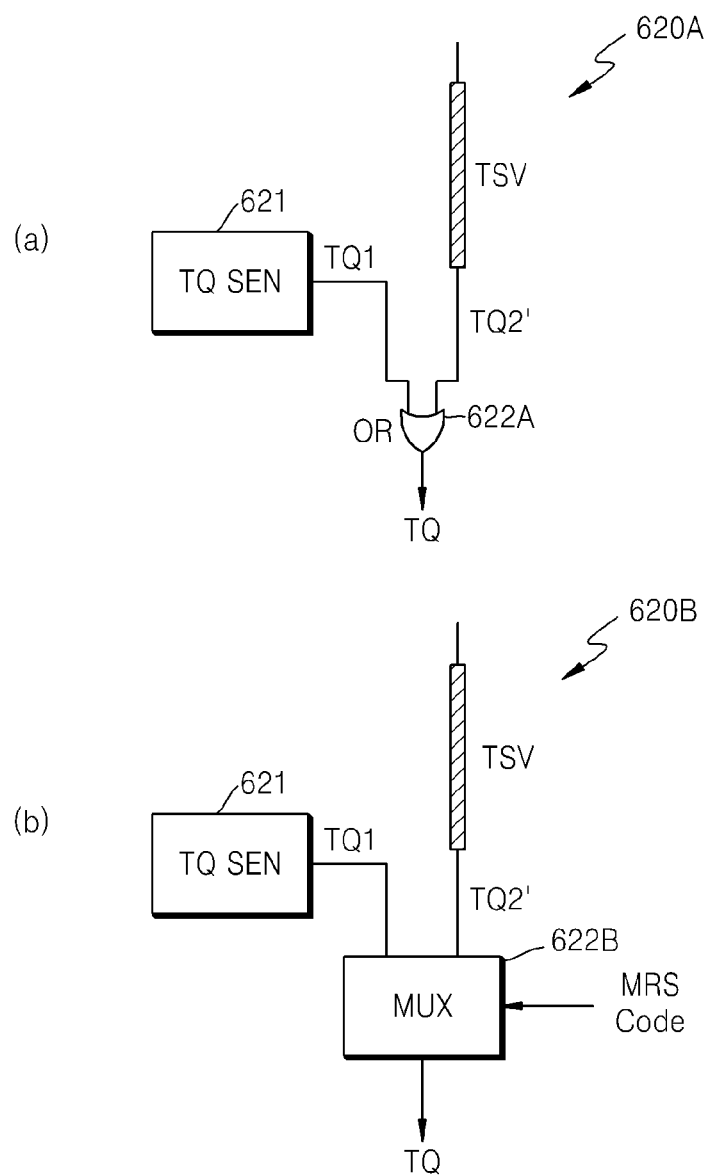
FIGS. 17 and 18 are block diagrams illustrating the algorithm units of FIG. 16, according to certain exemplary embodiments.

As shown in FIG. 16, a semiconductor device 600 includes a plurality of semiconductor layers, e.g., first through $n^{th}$ semiconductor layers LA1 through LAn. All of the first through $n^{th}$ semiconductor layers LA1 through LAn may be identical memory chips that include memory regions and have the same circuit layouts. Each of the first through $n^{th}$ semiconductor layers LA1 through LAn includes a memory region and a logic region. For example, first and second semiconductor layers LA1 and LA2 respectively include memory regions 610 and 630 and logic regions 620 and 640.

The embodiment of FIG. 16 uses a method of performing an arithmetic operation on temperature information of semiconductor layers to prevent temperature information of the first through $n^{th}$ semiconductor layers LA1 through LAn from colliding with one another in a common output path. Therefore, the first and second semiconductor layers LA1 through LA2 respectively include temperature sensor circuits 621 and 641 and arithmetic units 622 and 642. For example, $n^{th}$ temperature information of the $n^{th}$ semiconductor layer LAn is not immediately transmitted to the outside through a TSV of the semiconductor device 600 but is transmitted to the n-1$^{th}$ semiconductor layer LAn-1. An arithmetic operation is performed on the $n^{th}$ temperature information and n-1 temperature information of the n-1$^{th}$ semiconductor layer LAn-1. A result of the arithmetic operation is transmitted to the n-2$^{th}$ semiconductor layer LAn-2, and an arithmetic operation is performed on temperature information of the n-2$^{th}$ semiconductor layer LAn-2 like the arithmetic operation.

As shown in FIG. 16, temperature information TQ3' transmitted to the second semiconductor layer LA2 through a TSV TSV1_1 as a result of an arithmetic operation performed on temperature information of the third semiconductor layer LA3. The temperature sensor circuit 641 generates temperature information TQ2 of the second semiconductor layer LA2, and the algorithm unit 642 performs an arithmetic operation on the temperature information TQ2 and the temperature information TQ3' transmitted to the second semiconductor layer LA2. A result TQ2' of the arithmetic operation is transmitted to the first semiconductor layer LA1 through a TSV TSV1_2. The arithmetic unit 622 of the first semiconductor layer LA1 performs an arithmetic operation on the result TQ2' received through the TSV TSV1_2 and temperature information TQ1 generated by the temperature sensor circuit 621 and transmits a result TQ of the arithmetic operation as final temperature information of the semiconductor device 600 outside the semiconductor device 600.

FIGS. 17A and 17B are block diagrams illustrating exemplary logic regions of the arithmetic units 642 and 622 of FIG. 16, according to certain embodiments. FIG. 17A is a block diagram illustrating the arithmetic unit as an OR gate according to one embodiment. FIG. 17B is a block diagram illustrating the arithmetic unit as a multiplexer MUX according to one embodiment. For convenience, logic regions 620A and 620B shown in FIGS. 17A and 17B are logic regions of the first semiconductor layer LA1. Logic regions of the other semiconductor layers may be implemented according to the same or similar methods as the logic regions 620A and 620B shown in FIGS. 17A and 17B.

As shown in FIG. 17A, the arithmetic unit 622A of the first semiconductor layer LA1 receives first temperature information TQ1 from the temperature sensor circuit 621 and an arithmetic result TQ2' from the second semiconductor layer LA2 through a TSV and performs an arithmetic operation on the first temperature information TQ1 and the algorithm result TQ2'. As an example of an algorithm operation, the arithmetic unit 622A is realized as an OR gate, and thus an OR operation is performed on the first temperature information TQ1 and the arithmetic result TQ2'. A result of the OR operation is transmitted as final temperature information TQ.

In one embodiment, if a temperature of a semiconductor layer exceeds a predetermined reference value, temperature information corresponding to "1" may be generated. In this case, if the OR gate is used, although a temperature of one of a plurality semiconductor layers exceeds a reference value, final temperature information TQ may be generated as a value of "1." An external controller (not shown) may control a semiconductor device (e.g., a cycle of a refresh operation) with reference to the final temperature information TQ.

As an alternative to the OR gate, other logic gates may be used. For example, the arithmetic unit 622A may be implemented as an AND gate. If a temperature of a semiconductor layer exceeds a predetermined reference value, temperature information corresponding to "0" may be generated. In this case, if final temperature information TQ is generated as a value of "0" using the AND gate, a determination may be made that temperatures of one or more semiconductor layers have exceeded the reference value.

Although the temperature information TQ includes a plurality of bits, a determination may be made as to whether the temperature information TQ exceeds a reference temperature of a semiconductor layer through an appropriate algorithm operation. For example, a comparison operation or an average operation may be performed on the temperature information TQ1 of the first semiconductor layer LA1 and the arithmetic result TQ2' of the semiconductor layer LA2, and an arithmetic result of the comparison or average operation may be generated. In the case of the comparison operation, the arithmetic unit 622A may be realized as a comparator, may compare the temperature information TQ1 with a size of the algorithm result TQ2', and may generate information having a large value or information having a small value as an arithmetic result. Alternatively, the arithmetic unit 622A may be realized as an average calculator and thus may generate an average value of the temperature information TQ1 and the size of the algorithm result TQ2' as an arithmetic result.

In FIG. 17B, the arithmetic unit 622B is realized as the multiplexer MUX. The multiplexer MUX receives temperature information TQ1 and an arithmetic result TQ2' and selectively outputs one of the temperature information TQ1 and the arithmetic result TQ2'. Various methods may be applied to control an output of the multiplexer MUX. For example, the output of the multiplexer MUX may be controlled using an MRS code for setting an operation environment of the semiconductor device 600 to an initial operation of the semiconductor device 600. Temperature information of one of the first through $n^{th}$ semiconductor layers LA1 through LAn of the semiconductor device 600 is transmitted to the outside by setting the output of the multiplexer MUX.

Figure 18:
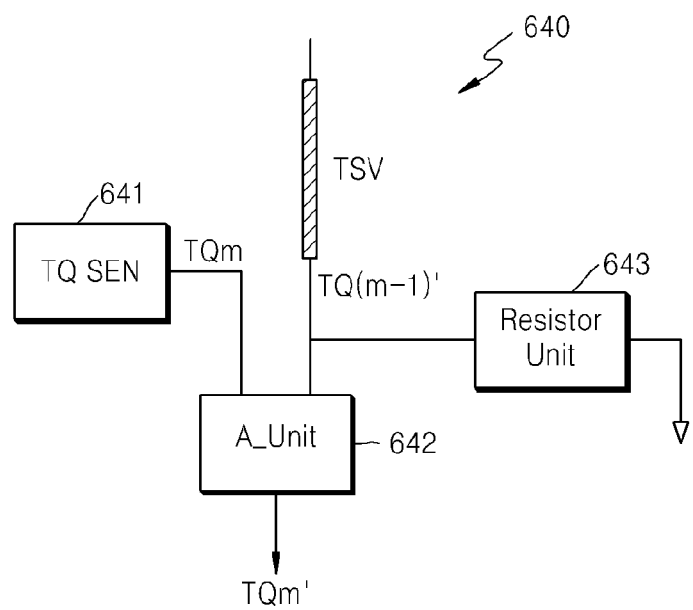

FIG. 18 is a block diagram illustrating the logic region 640 of FIG. 16, according to another exemplary embodiment. Referring to FIGS. 16 and 18, an algorithm result is not transmitted to the $n^{th}$ semiconductor layer LAn through a TSV. Thus, an input node of an algorithm unit 642 is in a floating state. Therefore, according to the embodiment of FIG. 18, the logic region 640 further includes a floating preventing unit besides a temperature sensor circuit 641 and the arithmetic unit 642, so that the input terminal of the algorithm unit 620 is prevented from being in the floating state. The logic region 640 includes a resistor unit 643 having a large resistance value as an example of the floating preventing unit. A terminal of the resistor unit 643 may be connected to a ground voltage. The logic region 640 of the $n^{th}$ semiconductor layer LAn is shown in FIG. 18, but logic regions of the other semiconductor layers may be implemented according to the same or a similar method as the logic region 640.

The arithmetic unit 642 receives temperature information TQm of a corresponding semiconductor layer and an arithmetic result TQ(m−1)' transmitted from an upper semiconductor layer and performs an arithmetic operation on the temperature information TQm and the arithmetic result TQ(m−1)'. In one embodiment, if the corresponding semiconductor layer is an uppermost semiconductor layer, the arithmetic result TQ(m−1)' is not transmitted. However, since the input node of the arithmetic unit 642 is connected to the ground voltage through the resistor unit 643, the input node of the arithmetic unit 642 is not in the floating state but has a level corresponding to the ground voltage. If the corresponding semiconductor layer is in a middle or lower position, the arithmetic result TQ(m−1)' transmitted from the upper semiconductor layer is transmitted to the input node of the arithmetic unit 642. Since the resistor unit 643 connected to the input node of the arithmetic unit 642 has a large resistance value, the algorithm result TQ(m−1)' may not be greatly affected by the ground voltage and may be appropriately transmitted to the input node of the arithmetic unit 642.

Figure 19:
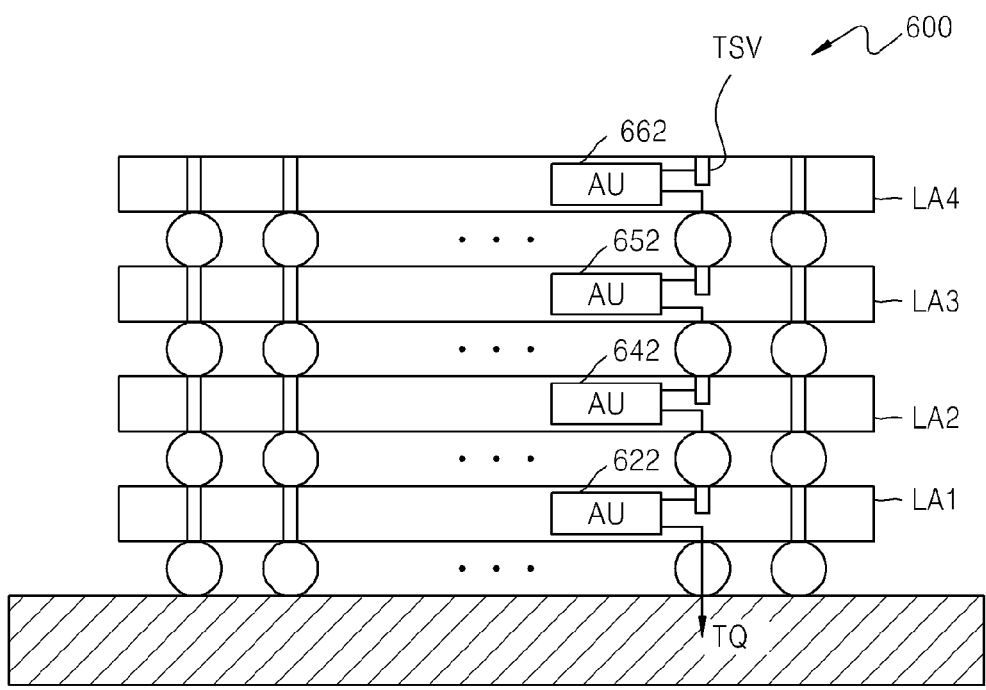
FIG. 19 is a cross-sectional view illustrating an exemplary output state of temperature information of the semiconductor device of FIG. 16, according to one embodiment.

FIG. 19 is a cross-sectional view illustrating an output state of temperature information of the semiconductor device 600 of FIG. 16, according to one exemplary embodiment. As shown in FIG. 19, the semiconductor device 600 includes a plurality of semiconductor layers, e.g., first through fourth semiconductor layers LA1 through LA4, which respectively include algorithm units 622, 642, 652, and 662, which perform algorithm operations on temperature information.

A first algorithm result of the algorithm unit 662 of an upper semiconductor layer, e.g., the fourth semiconductor layer LA, is transmitted to the third semiconductor layer LA3 through a TSV. In the embodiment of FIG. 19, the TSV penetrates a part of a semiconductor layer and not the whole semiconductor layer. Therefore, the first algorithm result is transmitted to the algorithm unit 652 of the third semiconductor layer LA3, and the algorithm unit 652 performs an algorithm operation on the first algorithm result and temperature information of the third semiconductor layer LA3 to generate a second algorithm result and transmits the second algorithm result to the second semiconductor layer LA2 through a TSV. Through an algorithm process as described above, an algorithm result of the algorithm unit 622 of the first semiconductor layer LA1 is transmitted as final temperature information TQ to outside the semiconductor device 600.

A semiconductor device according to another exemplary embodiment will now be described with reference to FIGS. 20 through 22.

Figure 20:
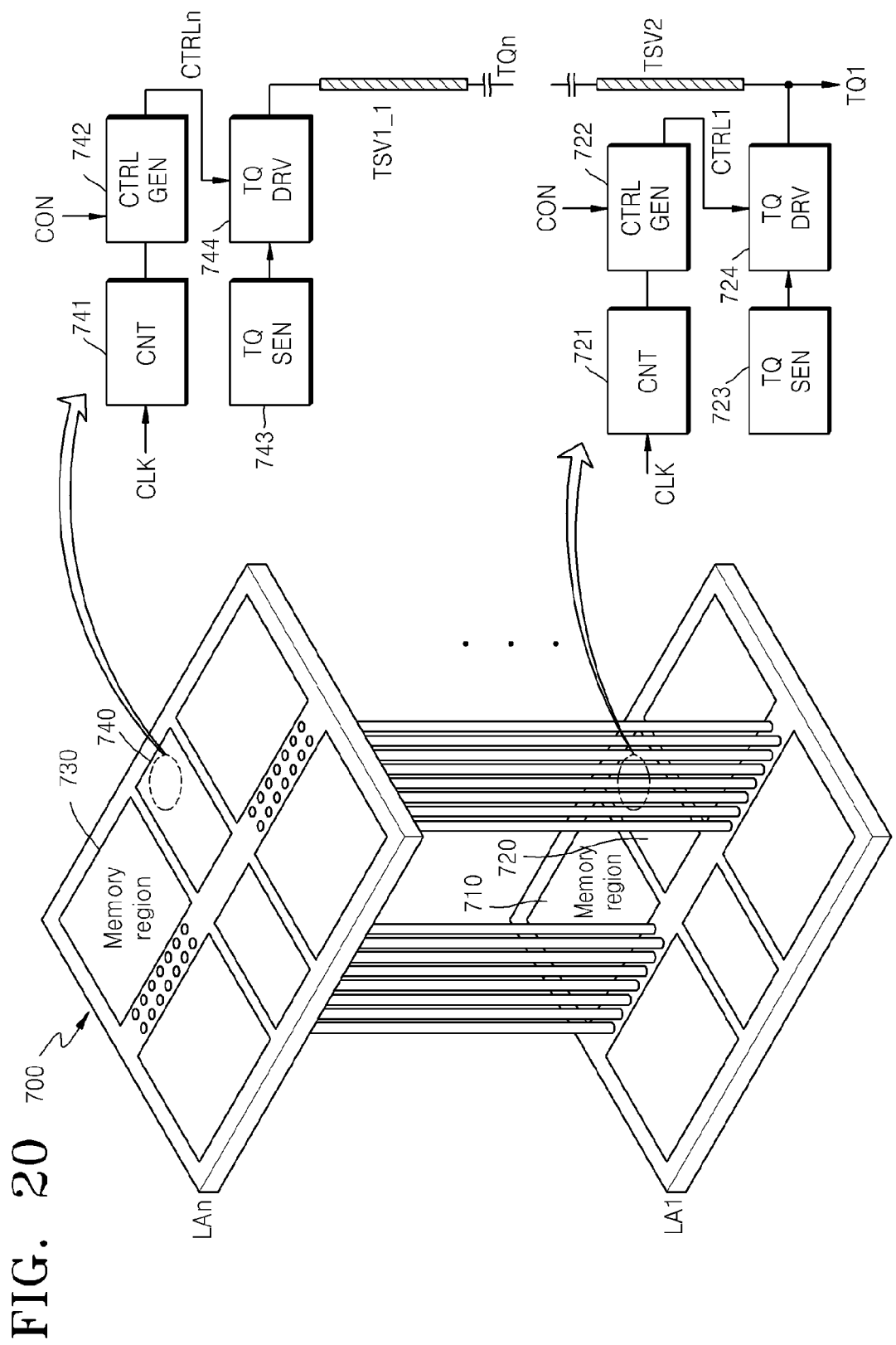
FIG. 20 illustrates an exemplary structure of a semiconductor device using a clock signal according to one embodiment.

As shown in FIG. 20, a semiconductor device 700 includes a plurality of semiconductor layers, e.g., first through $n^{th}$ semiconductor layers LA1 through LAn. In one embodiment, all of the first through $n^{th}$ semiconductor layers LA1 through LAn may include memory chips that include memory regions having the same configuration. Each of the first through $n^{th}$ semiconductor layers LA1 through LAn includes a memory region and a logic region, e.g., the first and $n^{th}$ semiconductor layers LA1 and LAn respectively include memory regions 710 and 730 and logic regions 720 and 740.

The embodiment of FIG. 20 uses a method of controlling an output timing of temperature information of each of the first through $n^{th}$ semiconductor layers LA1 through LAn using a clock signal CLK transmitted from the outside, so that the temperature information of the first through $n^{th}$ semiconductor layers LA1 through LAn is prevented from colliding with one another in a common output path. As shown in FIG. 20, each of the logic regions 720 and 740 includes a logic circuit which generates a control clock in response to the clock signal CLK. Counters 721 and 741 and control clock generators 722 and 742 may be installed as the logic circuits. An exemplary operation of the above-described embodiment will now be described with reference to FIGS. 20, 21A, and 21B.

Each of the counters 721 and 741 generates a plurality of clock signals (not shown) having different cycles using the clock signal CLK. Each of the control clock generators 722 and 742 generates a plurality of control clocks CTRL1 through CTRLn having different enable sections using the plurality of clock signals. As shown in FIG. 21B, the control clocks CTRL1 through CTRLn are sequentially enabled without overlapping with one another. The control clock generators 722 and 742 selectively transmit one of the control clocks CTRL1 through CTRLn to temperature information output units 724 and 744. The temperature information output units 724 and 744 may include output buffers which may be implemented as tri-state buffers.

In one embodiment, the temperature information output units 724 and 744 are controlled by different control clocks in each of the first through $n^{th}$ semiconductor layers LA1 through LAn so that temperature information is prevented from colliding with one another in a common output path. For example, the temperature information output unit 744 operates according to the n$^{th}$ control clock CTRLn in the n$^{th}$ semiconductor layer LAn, and the temperature information output unit 724 operates according to the first control clock CTRL1 in the first semiconductor layer LA1. Selection operations of the control clocks CTRL1 through CTRLn may be set according to a predetermined selection control signal CON. The selection control signal CON may be realized with reference to the above-described embodiments, e.g., an MRS code generated in an initial operation of the semiconductor device 700 may be used as the selection control signal CON.

In one embodiment, the semiconductor device 700 sequentially transmits temperature information of the first through n$^{th}$ semiconductor layers to the outside. For example, temperature information TQn generated by a temperature sensor circuit 743 of the n$^{th}$ semiconductor layer LAn is transmitted to the outside in response to the n$^{th}$ control clock CTRLn, and then temperature information TQ1 through TQn−1 of the n−1$^{th}$ through first semiconductor layers LAn−1 through LA1 is sequentially transmitted to the outside.

Figure 22:
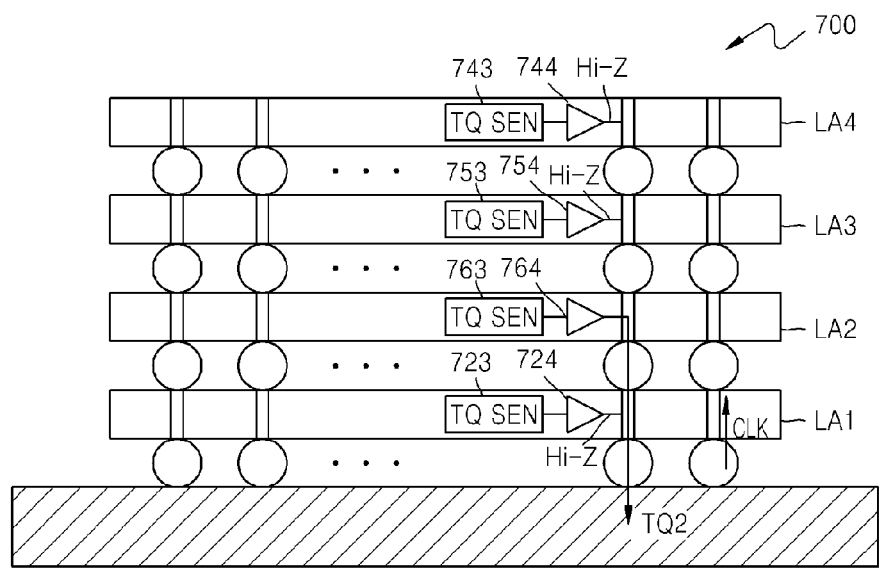
FIG. 22 is a cross-sectional view illustrating an exemplary output state of temperature information of the semiconductor device of FIG. 20, according to one embodiment.

FIG. 22 is a cross-sectional view illustrating an exemplary transmission operation of temperature information of the semiconductor device 600 of FIG. 20, according to one embodiment. A plurality of semiconductor layers, e.g., first through fourth semiconductor layers LA1 through LA4, respectively, include temperature sensor circuits 723, 763, 753, and 743 and tri-state buffers 724, 764, 754, and 744. A clock signal CLK transmitted from outside the semiconductor device 700 is transmitted to the first through fourth semiconductor layers LA1 through LA4, respectively, through one or more TSVs. The first through fourth semiconductor layers LA1 through LA4 generate a control clock CTRL as shown in FIGS. 21A and 21B using the clock signal CLK. In the embodiment of FIG. 22, temperature information TQ2 of the second semiconductor layer LA2 is transmitted outside the semiconductor device 700 through the tri-state buffer 764 according to the control clock CTRL. Also, outputs of the tri-state buffers 724, 754, and 744 of the other semiconductor layers, namely, the first, third, and fourth semiconductor layers LA1, LA3, and LA4, are in Hi-Z states.

Figure 23:
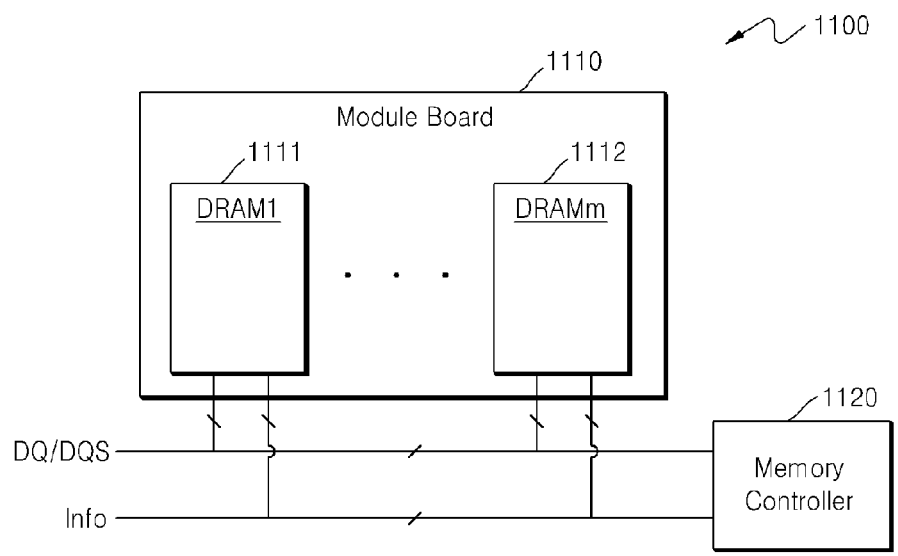
FIG. 23 is a block diagram illustrating an exemplary semiconductor memory system including a semiconductor memory module, according to one embodiment.

FIG. 23 is a block diagram illustrating an exemplary semiconductor memory system 1100 including a semiconductor memory module 1110, according to one embodiment. As shown in FIG. 23, the semiconductor memory module 1110 includes one or more semiconductor memory devices, namely semiconductor memory devices 1111 and 1112, which are installed on a module board. The semiconductor memory devices 1111 and 1112 are implemented as DRAMs in FIG. 23. However, other types of memory devices may be used. Each of the semiconductor memory devices 1111 and 1112 transmits data DQ, a data strobe signal DQS, and various pieces of information Info related to the semiconductor memory devices 1111 and 1112 to the outside through an output node (not shown). Each of the semiconductor memory devices 1111 and 1112 may also include a plurality of semiconductor layers or a plurality of semiconductor chips. One of the above-described embodiments may be applied when implementing the semiconductor memory devices 1111 and 1112.

The semiconductor memory system 1100 according to the embodiment shown in FIG. 23 includes the semiconductor memory module 1110 and a memory controller 1120. The memory controller 1120 transmits and receives various types of signals with the semiconductor memory module 1110 through a plurality of system buses. The memory controller 1120 receives information Info from the semiconductor memory module 1110 and controls the semiconductor memory module 1110 with reference to the information Info.

Figure 24:
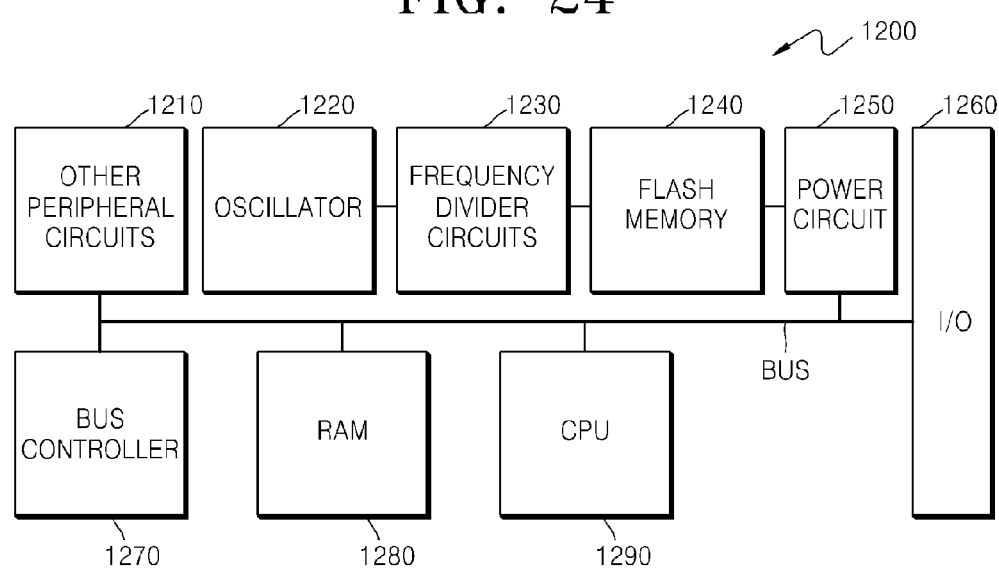
FIG. 24 is a block diagram illustrating an exemplary single chip microcomputer including a semiconductor memory device with a stacked structure, according to one embodiment.

FIG. 24 is a block diagram illustrating an exemplary single chip microcomputer 1200 including a semiconductor memory device with a stacked structure, according to one embodiment.

Referring to FIG. 24, the single chip microcomputer 1200 of a circuit module type includes a central processing unit (CPU) 1290, a RAM 1280 with a stacked structure used as a work area of the CPU 1290, a bus controller 1270, an oscillator 1220, a frequency divider 1230, a flash memory 1240, a power circuit 1250, an input/output (I/O) port 1260, and other peripheral circuits 1210 including a timer counter and the like. The components of the single chip microcomputer 1200 are connected to an internal bus.

The CPU 1290 includes a command control unit (not shown) and an execution unit (not shown), decodes a fetched command through the command control part, and performs a processing operation through the execution part according to the decoding result.

The flash memory 1240 is not limited to storing of an operation program or data of the CPU 1290 but stores various types of data. The power circuit 1250 generates a high voltage for erase and write operations of the flash memory 1240.

The frequency divider 1230 divides a source frequency transmitted from the oscillator 1220 into a plurality of frequencies to generate reference clock signals and other internal clock signals.

The internal bus includes an address bus, a data bus, and a control bus.

The bus controller 1270 controls a bus access by the predetermined cycle number in response to an access request transmitted from the CPU 1290. In one embodiment, the access cycle number is related to a bus width corresponding to a wait state and an access address.

If the single chip microcomputer 1200 is mounted on a system, the CPU 1290 controls the erase and write operations of the flash memory 1240. When testing or manufacturing a semiconductor device, the erase and write operations of the flash memory 1240 may be directly controlled through the I/O port 1260 as an external recording apparatus.

Figure 25:
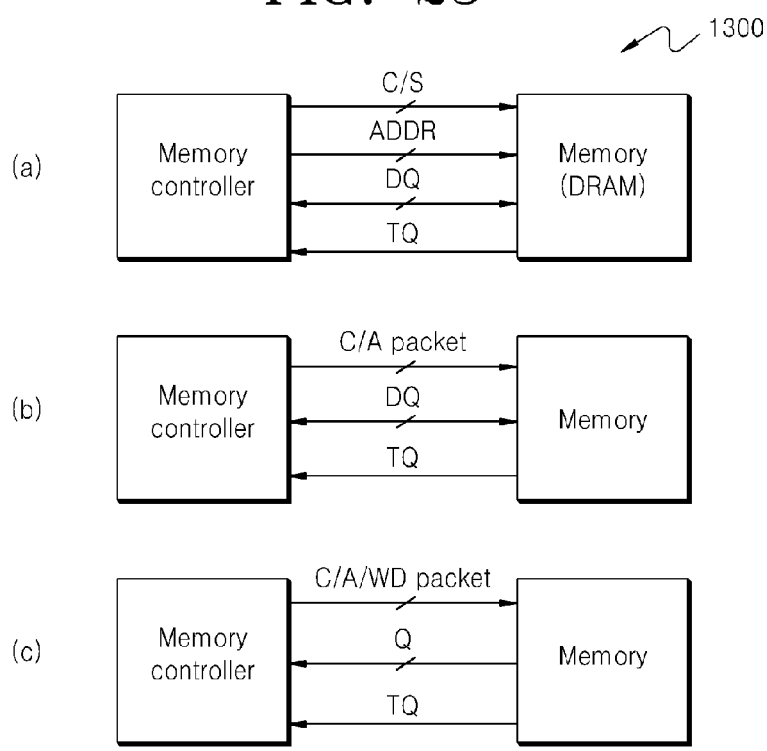
FIGS. 25A, 25B, and 25C respectively illustrate exemplary transmissions of signals between a memory controller and a memory of a semiconductor memory system, according to certain embodiments.

FIGS. 25A, 25B, and 25C respectively illustrate exemplary transmissions of signals between a memory controller and a memory device in a semiconductor memory system, according to certain embodiments.

Referring to FIG. 25A, a bus protocol is shown between the memory controller and the memory device, and control signals CS, such as CS, CKE, /RAS, /CAS, /WE and an address signal ADDR, are transmitted from the memory controller to the memory device. Data DQ is bidirectionally transmitted, and temperature information TQ is transmitted from the memory device to the memory controller in one direction. The memory device includes a plurality of semiconductor layers. Also, temperature information TQ of the semiconductor layers is sequentially transmitted to the memory controller or temperature information TQ of one of the semiconductor layers is fixedly transmitted to the memory controller.

Referring to FIG. 25B, packetized control signals and address signals C/A packets are transmitted from the memory controller to the memory device. Data DQ is bidirectionally transmitted, and temperature information TQ is transmitted from the memory device to the memory controller in one direction.

Referring to FIG. 25C, packetized control signals and address signals and write signals C/A/WD packet are transmitted from the memory controller to the memory device. A data output Q is transmitted from the memory device to the memory controller in one direction, and temperature information TQ is transmitted from the memory device to the memory controller in one direction.

Figure 26:
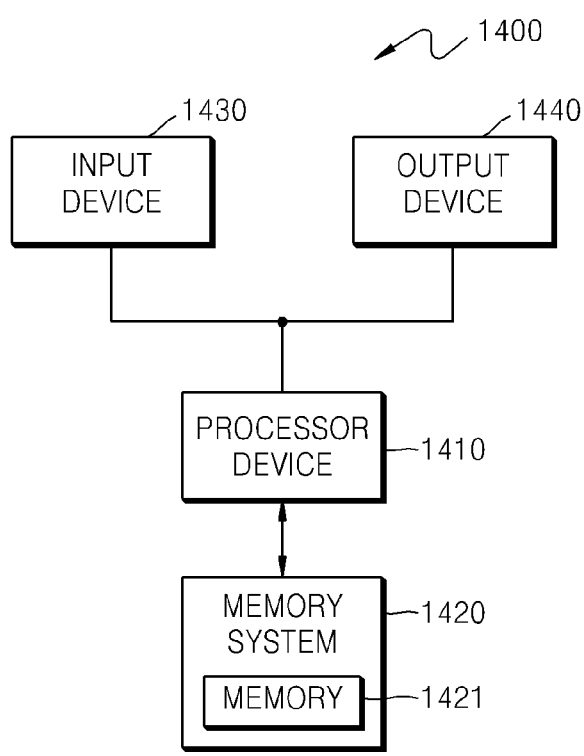
FIG. 26 is a block diagram illustrating an exemplary electronic system including a semiconductor memory device with a stacked structure, according to one embodiment.

FIG. 26 is a block diagram illustrating an exemplary electronic system 1400 including a semiconductor memory device with a stacked structure, according to one embodiment.

Referring to FIG. 26, the electronic system 1400 includes an input device 1430, an output device 1440, a memory system 1420, and a processor 1410.

The memory system 1420 includes a memory device 1421 with a stacked structure and a memory controller (not shown) for controlling the memory device 1421. The memory controller may be implemented as a semiconductor chip and thus stacked on the memory device 1421. In this case, a communication between the memory device 1421 and the memory controller may be performed through a TSV.

The processor device 1410 interfaces with the input device 1430, the output device 1440, and the memory system 1420 and thus controls an overall operation of the electronic system 1400.

While the present disclosure has been particularly shown and described with reference to exemplary embodiments thereof, it will be understood that various changes in form and details may be made therein without departing from the spirit and scope of the following claims.

What is claimed is:

1. A semiconductor device for a semiconductor package, the semiconductor device comprising:
    at least a first semiconductor chip including a first temperature sensor circuit configured to output first temperature information related to the first semiconductor chip;
    a first bump electrically connected to the first temperature sensor circuit without being electrically connected to a through substrate via; and
    a second bump electrically connected to a through substrate via of the first semiconductor chip.

2. The semiconductor device of claim 1, wherein the first temperature information is based on a temperature of the first semiconductor chip.

3. The semiconductor device of claim 1, further comprising:
    at least a second semiconductor chip stacked on the first semiconductor chip, wherein the second semiconductor chip is identical to the first semiconductor chip.

4. The semiconductor device of claim 3, further comprising:
    at least a third semiconductor chip and a fourth semiconductor chip stacked on the first semiconductor chip, wherein each of the third semiconductor chip and the fourth semiconductor chip is identical to the first semiconductor chip.

5. The semiconductor device of claim 1, further comprising:
    a package substrate,
    wherein the first bump and second bump electrically connect the first semiconductor chip to the package substrate.

6. The semiconductor device of claim 1, further comprising:
    a second semiconductor chip stacked on the first semiconductor chip,
    wherein the second semiconductor chip includes a second temperature sensor circuit electrically connected to a through substrate via.

7. The semiconductor device of claim 6, wherein:
    the first bump and second bump are electrically connected to a package substrate without a through substrate via; and
    the second temperature sensor circuit is electrically connected to the package substrate through at least one through substrate via.

8. A semiconductor package, comprising:
    a package substrate; and
    a first semiconductor chip on the package substrate, the first semiconductor chip including a plurality of through substrate vias for transmitting signals to the package substrate,
    wherein the first semiconductor chip includes a first temperature sensor circuit electrically coupled to the package substrate, and
    the first semiconductor chip is configured to transmit temperature information from the first temperature sensor circuit to the package substrate without using a through substrate via.

* * * * *